US012369353B2

(12) United States Patent
Park et al.

(10) Patent No.: US 12,369,353 B2
(45) Date of Patent: Jul. 22, 2025

(54) SEMICONDUCTOR DEVICE AND METHOD OF FABRICATING THE SAME

(71) Applicant: Samsung Electronics Co., Ltd., Suwon-si (KR)

(72) Inventors: Jun Mo Park, Seoul (KR); Yeon Ho Park, Seoul (KR); Wang Seop Lim, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 675 days.

(21) Appl. No.: 17/691,438

(22) Filed: Mar. 10, 2022

(65) Prior Publication Data
US 2023/0031546 A1 Feb. 2, 2023

(30) Foreign Application Priority Data

Aug. 2, 2021 (KR) .................. 10-2021-0101170

(51) Int. Cl.
*H10D 30/67* (2025.01)
*H10D 64/01* (2025.01)
(Continued)

(52) U.S. Cl.
CPC ....... *H10D 30/6735* (2025.01); *H10D 64/021* (2025.01); *H10D 84/0177* (2025.01);
(Continued)

(58) Field of Classification Search
CPC ........... H01L 29/42392; H01L 29/6656; H01L 29/41733; H01L 29/401; H01L 29/785;
(Continued)

(56) References Cited

U.S. PATENT DOCUMENTS 7,687,339 B1* 3/2010 Schultz ................. H01L 29/785
438/587
8,809,962 B2 8/2014 Liu et al.
(Continued)

FOREIGN PATENT DOCUMENTS

KR 10-2016-0137316 A 11/2016
WO WO-2017/171843 A1 10/2017

OTHER PUBLICATIONS

European Office Action dated Dec. 2, 2022 issued in European Application No. 22 169 665.1-1212.
(Continued)

*Primary Examiner* — Sitaramarao S Yechuri
(74) *Attorney, Agent, or Firm* — FINNEGAN, HENDERSON, FARABOW, GARRETT & DUNNER LLP

(57) ABSTRACT

There is provided a semiconductor device capable of improving the performance and reliability of a device. The semiconductor device including an active pattern extending in a first direction, a gate structure on the active pattern, the gate structure extending in a second direction different from the first direction and including a gate insulating layer and a gate filling layer, a gate spacer extending in the second direction, on a sidewall of the gate structure, a gate shield insulating pattern on a sidewall of the gate spacer, covering an upper surface of the gate insulating layer, and including an insulating material, and a gate capping pattern covering an upper surface of the gate filling layer, on the gate structure may be provided.

16 Claims, 46 Drawing Sheets

(51) Int. Cl.
*H10D 84/01* (2025.01)
*H10D 84/03* (2025.01)
*H10D 84/85* (2025.01)

(52) U.S. Cl.
CPC ........... *H10D 84/038* (2025.01); *H10D 84/85* (2025.01); *H10D 30/6729* (2025.01)

(58) Field of Classification Search
CPC ........... H01L 29/0673; H01L 29/42376; H01L 29/4966; H01L 29/4983; H01L 29/66545; H01L 29/66553; H01L 29/775; H01L 29/78696; H01L 29/66439; H01L 21/823842; H01L 21/28088; H01L 21/764; H01L 21/823864; H01L 21/823468; H01L 21/823456; H01L 21/823412; H01L 21/823437; H01L 21/823462; H01L 27/092; H01L 27/088; B82Y 10/00; H10D 30/6735; H10D 30/6729; H10D 30/43; H10D 30/014; H10D 30/62; H10D 30/6757; H10D 84/0177; H10D 84/038; H10D 84/85; H10D 84/0147; H10D 84/83; H10D 84/0142; H10D 84/0184; H10D 84/0128; H10D 84/0135; H10D 84/0144; H10D 62/121; H10D 64/021; H10D 64/018; H10D 64/518; H10D 64/667; H10D 64/671; H10D 64/01; H10D 64/017
See application file for complete search history.

(56) References Cited

U.S. PATENT DOCUMENTS

| | | | |
|---|---|---|---|
| 9,748,109 | B2 | 8/2017 | Liu et al. |
| 9,818,841 | B2 | 11/2017 | Chang et al. |
| 10,062,764 | B1 | 8/2018 | Wu et al. |
| 10,163,650 | B2 * | 12/2018 | Chiu ................. H01J 37/32357 |
| 10,297,663 | B2 | 5/2019 | Yeung et al. |
| 10,347,493 | B2 | 7/2019 | Li |
| 10,707,316 | B2 | 7/2020 | Huang et al. |
| 10,770,590 | B2 | 9/2020 | Zhou |
| 10,879,393 | B2 | 12/2020 | Chiang et al. |
| 2011/0014791 | A1 * | 1/2011 | Johnson .......... H01L 21/823431 257/E21.249 |
| 2013/0049142 | A1 | 2/2013 | Liu et al. |
| 2016/0284699 | A1 | 9/2016 | Jeong et al. |
| 2019/0067467 | A1 | 2/2019 | Zhou |
| 2020/0388707 | A1 | 12/2020 | Shen et al. |
| 2021/0066453 | A1 | 3/2021 | Lee et al. |
| 2021/0098598 | A1 * | 4/2021 | Yang ................ H01L 21/31144 |
| 2021/0408234 | A1 * | 12/2021 | Huang ............. H01L 29/66439 |

OTHER PUBLICATIONS

European Search Report dated Nov. 21, 2022 issued in European Application No. 22169665.1-1212.

* cited by examiner

SEMICONDUCTOR DEVICE AND METHOD OF FABRICATING THE SAME

CROSS-REFERENCE TO RELATED APPLICATION

This application claims priority from Korean Patent Application No. 10-2021-0101170 filed on Aug. 2, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to semiconductor devices and/or methods of fabricating the same.

2. Description of the Related Art

As one of scaling techniques for increasing the density of semiconductor devices, a multi-gate transistor has been proposed, in which a fin- or nanowire-shaped multi-channel active pattern (or silicon body) is formed on a substrate and a gate is formed on the surface of the multi-channel active pattern.

Because the multi-gate transistor uses a three-dimensional (3D) channel, scaling of the multi-gate transistor can be easily achieved. Further, current control capability can be improved without increasing the gate length of the multi-gate transistor. In addition, a short channel effect (SCE) in which the potential of a channel region is affected by a drain voltage can be effectively suppressed.

SUMMARY

Some aspects of the present disclosure provide semiconductor devices capable of improving performance and reliability.

Some aspects of the present disclosure also provide methods of fabricating a semiconductor device capable of improving performance and reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising an active pattern extending in a first direction, a gate structure on the active pattern, the gate structure extending in a second direction different from the first direction and including a gate insulating layer and a gate filling layer, a gate spacer extending in the second direction, on a sidewall of the gate structure, a gate shield insulating pattern on a sidewall of the gate spacer, covering an upper surface of the gate insulating layer, and including an insulating material, and a gate capping pattern covering an upper surface of the gate filling layer, on the gate structure.

According to another aspect of the present disclosure, there is provided a semiconductor device comprising a first gate structure extending in a first direction in a first region of a substrate and including a first gate insulating layer and a first gate filling layer, a second gate structure extending in a second direction in a second region of the substrate and including a second gate insulating layer and a second gate filling layer, a first gate spacer extending in the first direction, on a sidewall of the first gate structure, a second gate spacer extending in the second direction, on a sidewall of the second gate structure, a gate shield insulating pattern on a sidewall of the first gate spacer, covering an upper surface of the first gate insulating layer, and including an insulating material, a first gate capping pattern covering an upper surface of the first gate filling layer, on the first gate structure, and a second gate capping pattern covering an upper surface of the second gate structure, on the second gate structure, wherein a width of the first gate structure in a third direction perpendicular to the first direction is smaller than a width of the second gate structure in a fourth direction perpendicular to the second direction.

According to still another aspect of the present disclosure, there is provided a semiconductor device comprising an active pattern including a fin-shaped pattern extending in a first direction and a sheet pattern on the fin-shaped pattern, a gate structure on the active pattern, the gate structure extending in a second direction different from the first direction and including a gate insulating layer and a gate filling layer, a gate spacer extending in the second direction, on a sidewall of the gate structure, a gate shield insulating pattern on a portion of a sidewall of the gate spacer, covering an upper surface of the gate insulating layer, and including an insulating material, and a gate capping pattern on the gate structure, the gate capping pattern covering an upper surface of the gate filling layer and being not in contact with the upper surface of the gate insulating layer, wherein with respect to an upper surface of the sheet pattern, the upper surface of the gate insulating layer is lower than the upper surface of the gate filling layer.

According to still another aspect of the present disclosure, there is provided a semiconductor device comprising an active pattern extending in a first direction, a gate structure on the active pattern, the gate structure extending in a second direction different from the first direction and including a gate liner pattern and a gate upper pattern, the gate liner pattern including a gate insulating layer and a lower conductive liner, the gate upper pattern including an upper conductive liner and a gate filling layer, a gate spacer extending in the second direction, on a sidewall of the gate structure, and a gate capping pattern covering an upper surface of the gate filling layer, on the gate structure, wherein an upper surface of the gate liner pattern includes an inclined surface, an upper surface of the gate upper pattern has a concave shape, the upper surface of the gate liner pattern has a first step, and the upper surface of the gate upper pattern has a second step greater than the first step.

According to still another aspect of the present disclosure, there is provided a method of fabricating a semiconductor device comprising forming, on an active pattern, a gate trench crossing the active pattern and defined by a gate spacer, sequentially forming a pre-gate insulating layer and a lower gate conductive layer along a sidewall and a bottom surface of the gate trench, forming a sacrificial pattern filling a part of the gate trench, on the lower gate conductive layer, forming a gate insulating layer and a lower conductive liner by removing the pre-gate insulating layer and the lower gate conductive layer protruding above an upper surface of the sacrificial pattern, forming a gate shield insulating pattern extending along a sidewall of the gate trench on an upper surface of the gate insulating layer and an upper surface of the lower conductive liner, after removing the sacrificial pattern, forming a pre-gate filling layer filling the gate trench, on the lower conductive liner and the gate shield insulating pattern, forming a gate filling layer by removing a part of the pre-gate filling layer, and forming a gate capping pattern on the gate filling layer.

BRIEF DESCRIPTION OF THE DRAWINGS

The above and other aspects and features of the present disclosure will become more apparent by describing in detail some example embodiments thereof with reference to the attached drawings, in which.

DETAILED DESCRIPTION

Although the drawings relating to semiconductor devices according to some example embodiments of the present disclosure illustratively show a fin-type transistor (FinFET) including a channel region having a fin-shaped pattern, or a transistor including nanowires or nanosheets, the present disclosure is not limited thereto. The technical concepts of the present disclosure can be applied to transistors based on two-dimensional materials (2D material based FETs) and heterostructures thereof.

Further, the semiconductor devices according to some example embodiments may include a tunneling FET or a three-dimensional (3D) transistor. The semiconductor device according to some example embodiments may include a bipolar junction transistor, a lateral double diffusion MOS (LDMOS) transistor, or the like.

Figure 1:
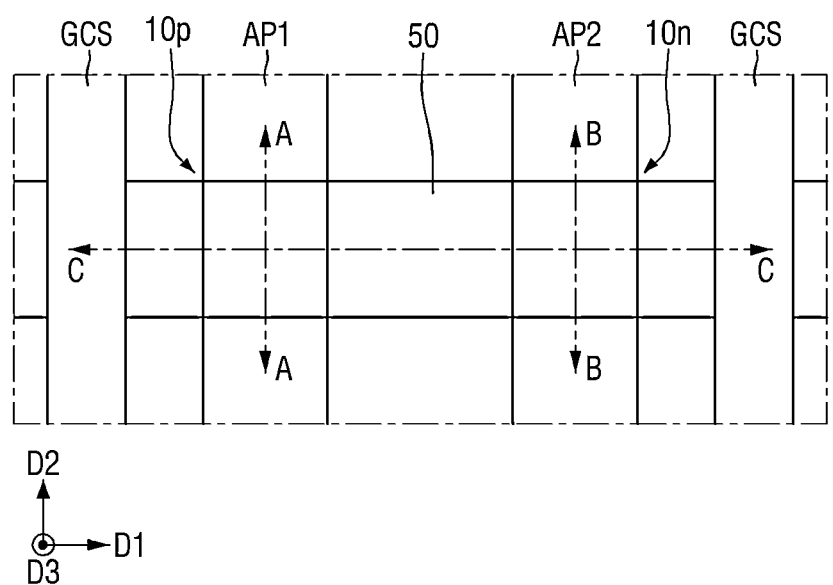
FIG. 1 is a layout diagram illustrating a semiconductor device according to some example embodiments.
Figure 2:
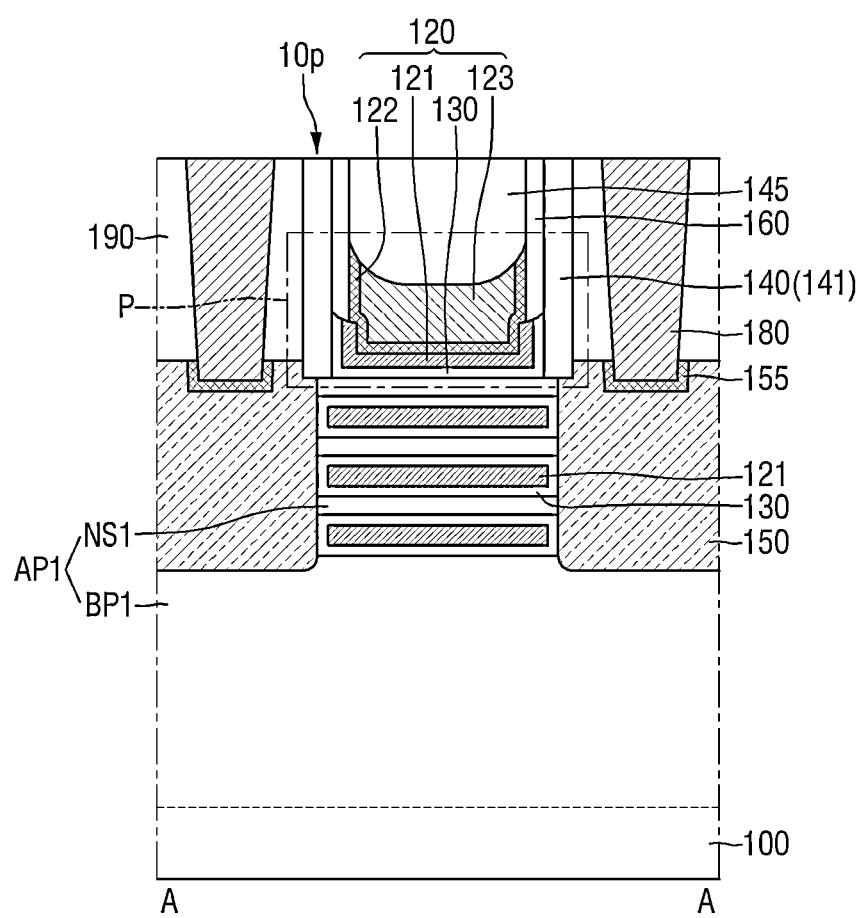
FIGS. 2, 3 and 4 show cross-sectional views taken along lines A-A, B-B and C-C of FIG. 1, respectively.
Figure 3:
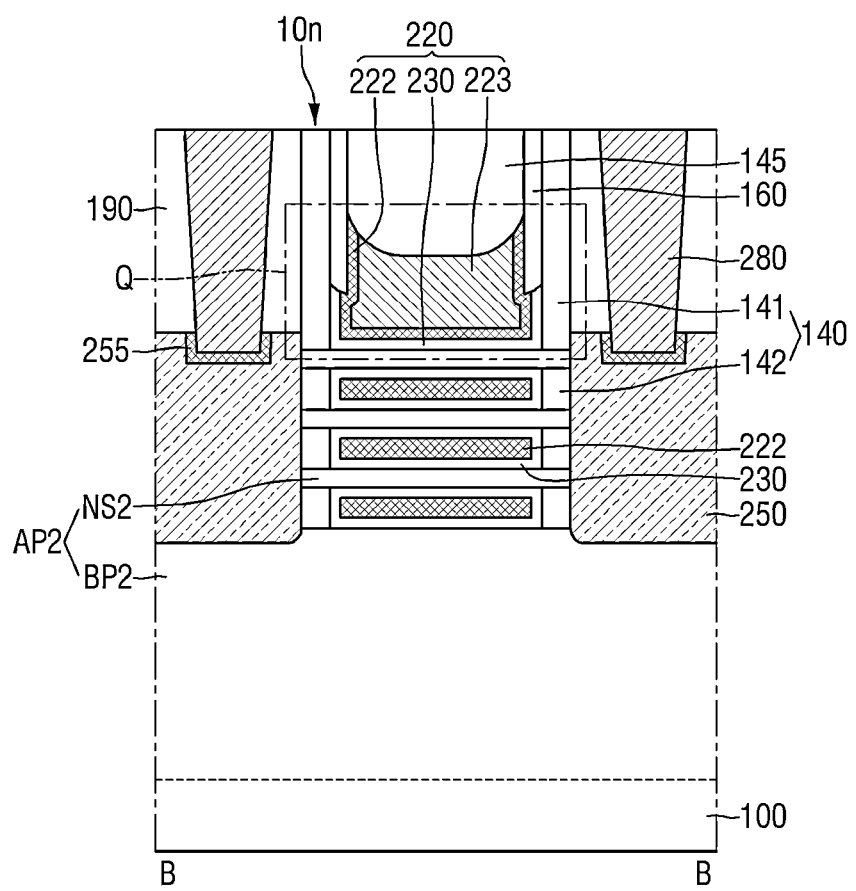
Figure 4:
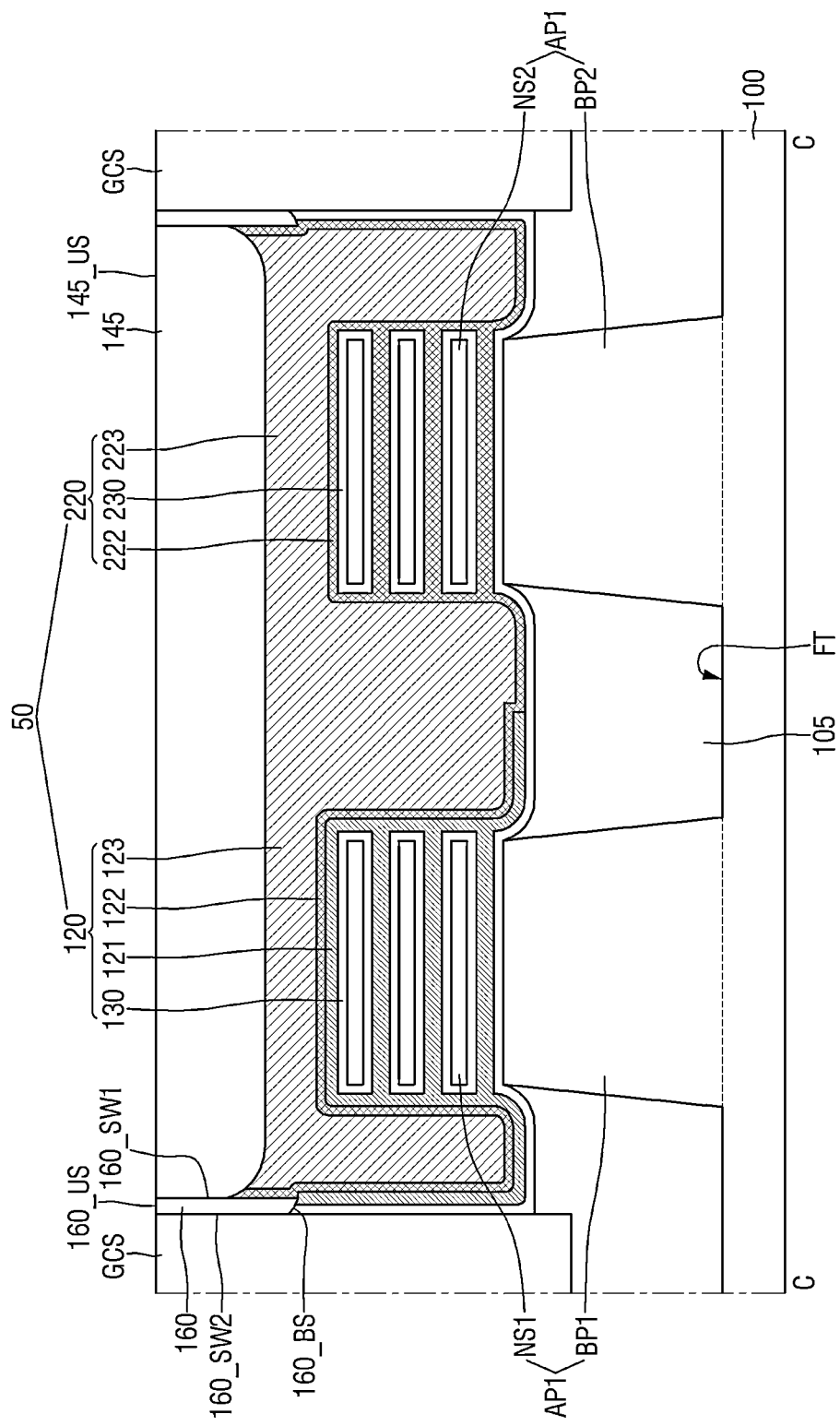
Figure 5:
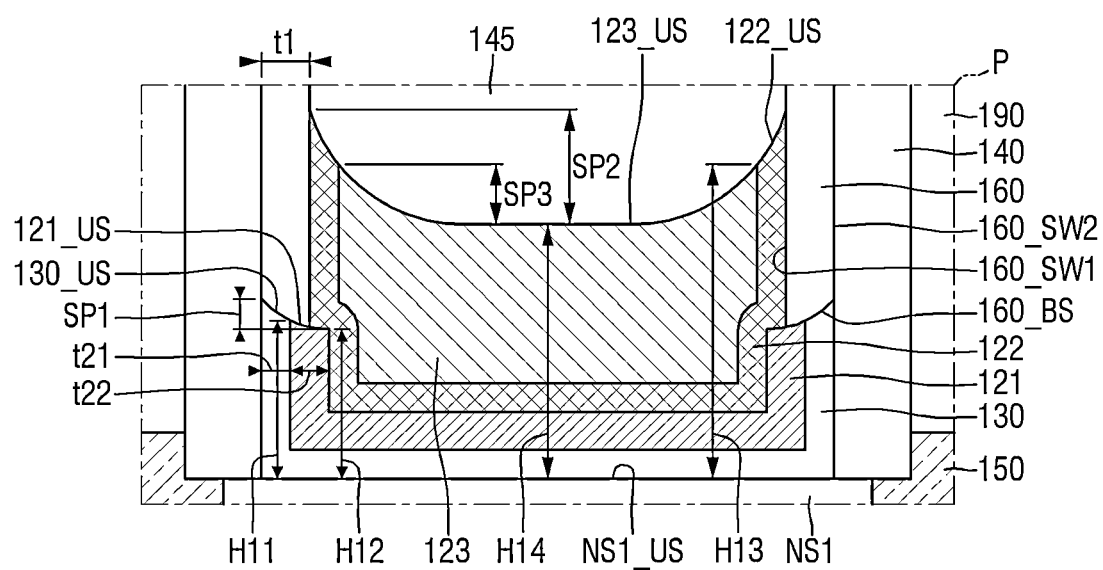
FIG. 5 is an enlarged view of part P of FIG. 2.
Figure 6:
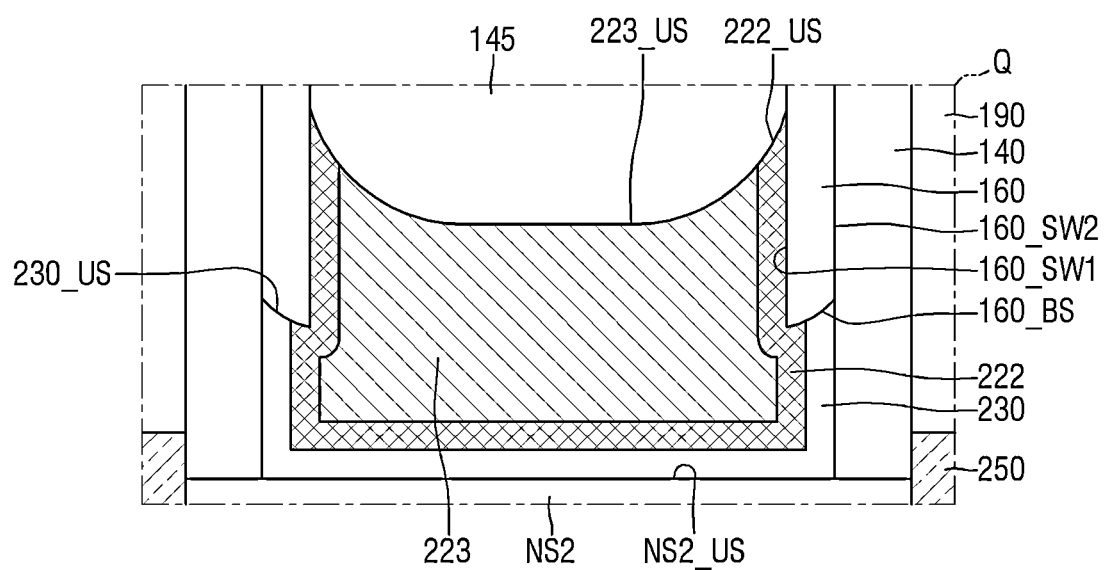
FIG. 6 is an enlarged view of part Q of FIG. 3.

FIG. 1 is a layout diagram illustrating a semiconductor device according to some example embodiments. FIGS. 2, 3, and 4 show cross-sectional views taken along lines A-A, B-B and C-C of FIG. 1, respectively. FIG. 5 is an enlarged view of part P of FIG. 2. FIG. 6 is an enlarged view of part Q of FIG. 3.

Referring to FIGS. 1 to 6, a semiconductor device according to some example embodiments may include a first active pattern AP1, a second active pattern AP2, a first connection gate structure 50, and a gate shield insulating pattern 160.

The substrate 100 may be a bulk silicon or silicon-on-insulator (SOI) substrate. In some example embodiments, the substrate 100 may be a silicon substrate, or may include other materials such as silicon germanium, silicon germanium on insulator (SGOI), indium antimonide, a lead tellurium compound, indium arsenide, indium phosphide, gallium arsenide, or gallium antimonide, but is not limited thereto.

The first active pattern AP1 and the second active pattern AP2 may be disposed on the substrate 100. Each of the first active pattern AP1 and the second active pattern AP2 may be elongated in a second direction D2. The first active pattern AP1 and the second active pattern AP2 may be adjacent to each other in a first direction D1. The first active pattern AP1 and the second active pattern AP2 may be spaced apart in a first direction D1. For example, the first direction D1 is a direction crossing the second direction D2.

As one example, the first active pattern AP1 may be a region in which a PMOS is formed, and the second active pattern AP2 may be a region in which an NMOS is formed. The first active pattern AP1 may include a channel region of a PMOS, and the second active pattern AP2 may include a channel region of an NMOS.

As one example, the first active pattern AP1 and the second active pattern AP2 may be active regions included in a logic region. The first active pattern AP1 and the second active pattern AP2 may be active regions included in one standard cell.

As another example, the first active pattern AP1 and the second active pattern AP2 may be active regions included in an SRAM region. The first active pattern AP1 may be a region in which a pull-up transistor of the SRAM is formed, and the second active pattern AP2 may be a region in which a pull-down transistor or a pass transistor of the SRAM is formed, but the present disclosure is not limited thereto.

The first active pattern AP1 may include a first lower pattern BP1 and a plurality of first sheet patterns NS1. The second active pattern AP2 may include a second lower pattern BP2 and a plurality of second sheet patterns NS2.

The first lower pattern BP1 and the second lower pattern BP2 may each protrude from the substrate 100. The first lower pattern BP1 and the second lower pattern BP2 may each extend in the second direction D2. Each of the first lower pattern BP1 and the second lower pattern BP2 may have a fin-shaped pattern.

The first lower pattern BP1 may be spaced apart from the second lower pattern BP2 in the first direction D1. The first lower pattern BP1 and the second lower pattern BP2 may be separated by a fin trench FT extending in the second direction D2.

The plurality of first sheet patterns NS1 may be disposed on the first lower pattern BP1. The plurality of first sheet patterns NS1 may be spaced apart from the first lower pattern BP1 in the third direction D3.

The plurality of second sheet patterns NS2 may be disposed on the second lower pattern BP2. The plurality of second sheet patterns NS2 may be spaced apart from the second lower pattern BP2 in the third direction D3.

The first sheet patterns NS1 may be sequentially disposed in the third direction D3. The first sheet patterns NS1 may be spaced apart from each other in the third direction D3. The second sheet patterns NS2 may be sequentially disposed in the third direction D3. The second sheet patterns NS2 may be spaced apart from each other in the third direction D3. Here, the third direction D3 may be a direction perpendicular to the first direction D1 and the second direction D2. For example, the third direction D3 may be a thickness direction of the substrate 100. The first direction D1 may be a direction perpendicular to the second direction D2.

Although it is illustrated that three first sheet patterns NS1 and three second sheet patterns NS2 are disposed in the third direction D3, this is only for simplicity of description and the present disclosure is not limited thereto.

Each of the first lower pattern BP1 and the second lower pattern BP2 may be formed by etching a part of the substrate 100 and/or may include an epitaxial layer grown from the substrate 100. Each of the first lower pattern BP1 and the second lower pattern BP2 may include, for example, silicon or germanium, which is an elemental semiconductor material. Further, each of the first lower pattern BP1 and the second lower pattern BP2 may include a compound semiconductor, for example, a group IV-IV compound semiconductor or a group III-V compound semiconductor.

The group IV-IV compound semiconductor may be a binary compound or a ternary compound including at least two elements selected from the group consisting of carbon (C), silicon (Si), germanium (Ge) and tin (Sn), or the above-mentioned compound doped with a group IV element.

The group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimony (Sb) which are group V elements.

Each of the first sheet patterns NS1 may include one of silicon or germanium, which is an elemental semiconductor material, a group IV-IV compound semiconductor, or a group III-V compound semiconductor. Each of the second sheet patterns NS2 may include one of silicon or germanium, which is an elemental semiconductor material, a group IV-IV compound semiconductor, or a group III-V compound semiconductor.

The width of the first sheet pattern NS1 in the first direction D1 may increase or decrease in proportion to the width of the first lower pattern BP1 in the first direction D1. The width of the second sheet pattern NS2 in the first direction D1 may increase or decrease in proportion to the width of the second lower pattern BP2 in the first direction D1.

The first field insulating layer 105 may be formed on the substrate 100. The first field insulating layer 105 may fill at least a part of the fin trench FT.

The first field insulating layer 105 may be disposed on the substrate 100 between the first active pattern AP1 and the second active pattern AP2. The first field insulating layer 105 may be in direct contact with the first active pattern AP1 and the second active pattern AP2.

The fact that the first field insulating layer 105 is directly in contact with the first active pattern AP1 and the second active pattern AP2 may mean that the active pattern used as a channel region of a transistor is not interposed between the first active pattern AP1 and the second active pattern AP2. The first field insulating layer 105 may be disposed between the first lower pattern BP1 and the second lower pattern BP2. The first field insulating layer 105 may be directly in contact with the first lower pattern BP1 and the second lower pattern BP2.

As one example, the first field insulating layer 105 may entirely cover the sidewall of the first lower pattern BP1 and the sidewall of the second lower pattern BP2 defining the fin trench FT. Unlike that illustrated in the drawing, as another example, the first field insulating layer 105 may cover a portion of the sidewall of the first lower pattern BP1 and/or a portion of the sidewall of the second lower pattern BP2 that define the fin trench FT. For example, a portion of the first lower pattern BP1 and/or a portion of the second lower pattern BP2 may protrude above the upper surface of the first field insulating layer 105 in the third direction D3. Each of the first sheet patterns NS1 and each of the second sheet patterns NS2 are disposed higher than the upper surface of the first field insulating layer 105.

The first field insulating layer 105 may include, for example, an oxide film, a nitride film, an oxynitride film, or a combination film thereof. Although it is illustrated that the first field insulating layer 105 is a single layer, the present disclosure is not limited thereto. Unlike that illustrated in the drawing, the first field insulating layer 105 may include a field liner extending along the sidewall and the bottom surface of the fin trench FT, and a field filling layer on the field liner.

The first connection gate structure 50 may be formed on the substrate 100. The first connection gate structure 50 may be disposed on the first field insulating layer 105. The first connection gate structure 50 may cross the first active pattern AP1, the second active pattern AP2, and the first field insulating layer 105. The first connection gate structures 50 may be elongated in the first direction D1.

The first connection gate structure 50 may cross the first lower pattern BP1 and the second lower pattern BP2. The first connection gate structure 50 may surround each of the first sheet patterns NS1 and each of the second sheet patterns NS2.

The first connection gate structure 50 may include a first gate structure 120 and a second gate structure 220. For example, the first gate structure 120 may be a p-type gate structure, and the second gate structure 220 may be an n-type gate structure. In a semiconductor device according to some example embodiments, the first gate structure 120 and the second gate structure 220 may be in contact with each other, specifically, may be directly in contact with each other.

The first gate structure 120 may be formed on the first active pattern AP1. The first gate structure 120 may cross the first active pattern AP1. The first gate structure 120 may include a p-type gate electrode.

The first gate structure 120 may cross the first lower pattern BP1. The first gate structure 120 may surround each of the first sheet patterns NS1.

The second gate structure 220 may be formed on the second active pattern AP2. The second gate structure 220 may cross the second active pattern AP2. The second gate structure 220 may include an n-type gate electrode.

The second gate structure 220 may cross the second lower pattern BP2. The second gate structure 220 may surround each of the second sheet patterns NS2.

A first p-channel transistor $10p$ may be defined in a region in which the first gate structure 120 and the first active pattern AP1 cross, and a first n-channel transistor $10n$ may be defined in a region in which the second gate structure 220 and the second active pattern AP2 cross.

Because the first gate structure 120 extends on the first field insulating layer 105, the first gate structure 120 overlaps not only the first active pattern AP1, but also a portion of the first field insulating layer 105. Because the second gate structure 220 extends on the first field insulating layer 105, the second gate structure 220 overlaps not only the second active pattern AP2, but also a portion of the first field insulating layer 105. A boundary between the first gate structure 120 and the second gate structure 220 may be positioned on the upper surface of the first field insulating layer 105.

The first connection gate structure 50 may include a first connection gate insulating layer 130 and 230 (e.g., a first gate insulating layer 130 and a second gate insulating layer 230), a first lower conductive liner 121, a first connection upper conductive liner 122 and 222 (e.g., a first upper conductive liner 122 and a second upper conductive liner 222), and a first connection gate filling layer 123 and 223 (e.g., a first gate filling layer 123 and a second gate filling layer 223).

For example, the first gate structure 120 may include a first gate insulating layer 130, the first lower conductive liner 121, a first upper conductive liner 122, and a first gate filling layer 123. The first lower conductive liner 121 and the first upper conductive liner 122 may be disposed between the first gate insulating layer 130 and the first gate filling layer 123. The second gate structure 220 may include a second gate insulating layer 230, a second upper conductive liner 222, and a second gate filling layer 223. The second upper conductive liner 222 may be disposed between the second gate insulating layer 230 and the second gate filling layer 223.

The first gate insulating layer 130 may be disposed on the first active pattern AP1. The first gate insulating layer 130 may extend along the upper surface of the first field insulating layer 105 and the upper surface of the first lower pattern BP1. The first gate insulating layer 130 may surround each of the first sheet patterns NS1. The first gate insulating layer 130 may be disposed along the perimeter of each of the first sheet patterns NS1.

The second gate insulating layer 230 may be disposed on the second active pattern AP2. The second gate insulating layer 230 may extend along the upper surface of the first field insulating layer 105 and the upper surface of the second lower pattern BP2. The second gate insulating layer 230 may surround each of the second sheet patterns NS2. The second gate insulating layer 230 may be disposed along the perimeter of each of the second sheet patterns NS2. The first gate insulating layer 130 and the second gate insulating layer 230 may be directly in contact with the upper surface of the first field insulating layer 105. The first gate insulating layer 130 and the second gate insulating layer 230 are formed at the same level. Here, the term "same level" means that they are formed by the same fabricating process. The first gate insulating layer 130 and the second gate insulating layer 230 may be disposed over the first active pattern AP1 and the second active pattern AP2, respectively. A boundary between the first gate insulating layer 130 and the second gate insulating layer 230 may not be distinguished.

The first gate insulating layer 130 and the second gate insulating layer 230 may include silicon oxide, silicon oxynitride, silicon nitride, or a high-k material having a dielectric constant greater than that of silicon oxide. The high-k material may include, for example, at least one selected from the group consisting of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In FIGS. 2 to 4, the first gate insulating layer 130 and the second gate insulating layer 230 are illustrated as a single layer, but are not limited thereto. The first gate insulating layer 130 and the second gate insulating layer 230 may be a multilayer including an interface layer and a high-k insulating layer on the interface layer.

The semiconductor device according to some example embodiments may include a negative capacitor (NC) FET using a negative capacitor (NC). For example, the first and second gate insulating layers 130 and 230 may include a ferroelectric material layer having ferroelectric properties and/or a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor. On the other hand, when at least one of the capacitances of two or more capacitors connected in series has a negative value, the total capacitance may have a positive value and may be greater than the absolute value of each capacitance.

When a ferroelectric material layer having a negative capacitance and a paraelectric material layer having a positive capacitance are connected in series, the total capacitance value of the ferroelectric material layer and the paraelectric material layer connected in series may increase. By using the principle that the total capacitance value is increased, the transistor containing the ferroelectric material layer may have a subthreshold swing (SS) lower than or equal to a threshold voltage lower than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, or lead zirconium titanium oxide. In this case, as one example, the hafnium zirconium oxide may be a material containing hafnium oxide doped with zirconium (Zr). As another example, the hafnium zirconium oxide may be a compound of hafnium (Hf), zirconium (Zr), and oxygen (O).

The ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic percent (at %) of aluminum. In this case, the ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include, for example, at least one of silicon oxide or metal oxide having a high dielectric constant. The metal oxide included in the paraelectric material layer may include, for example, at least one of hafnium oxide, zirconium oxide, or aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer is different from the crystal structure of the hafnium oxide included in the paraelectric material layer.

The ferroelectric material layer may have a thickness that exhibits ferroelectric properties. The thickness of the ferroelectric material layer may be, for example, in a range of 0.5 nm to 10 nm, but is not limited thereto. Because a critical thickness at which each ferroelectric material exhibits ferroelectric properties may be different, the thickness of the ferroelectric material layer may vary depending on the ferroelectric material.

In one example, the first and second gate insulating layers 130 and 230 may include one ferroelectric material layer. In another example, the first and second gate insulating layers 130 and 230 may include a plurality of ferroelectric material layers spaced apart from each other. The first and second gate insulating layers 130 and 230 may have a stacked structure in which a plurality of ferroelectric material layers and a plurality of paraelectric material layers are alternately stacked.

The first lower conductive liner 121 may be disposed on the first active pattern AP1. The first lower conductive liner 121 may be formed on the first gate insulating layer 130. The first lower conductive liner 121 may be disposed on the connection gate insulating layer 130 and 230 on the first active pattern AP1. The first lower conductive liner 121 may surround each of the first sheet patterns NS1. The first lower conductive liner 121 may be disposed along the perimeter of each of the first sheet patterns NS1.

The first lower conductive liner 121 may entirely fill a space between the first lower pattern BP1 and the first sheet pattern NS1 and a space between the adjacent first sheet patterns NS1. For example, when the first lower sheet pattern NS1 and the first upper sheet pattern NS1 that are immediately adjacent in the third direction D3 exist, the first lower conductive liner 121 may entirely fill the space between the upper surface of the first lower sheet pattern NS1 and the bottom surface of the first upper sheet pattern NS1 facing each other in the third direction D3.

The first lower conductive liner 121 may not be disposed on the second active pattern AP2. The first lower conductive liner 121 may not extend to the second active pattern AP2. The first lower conductive liner 121 may not be formed on the second gate insulating layer 230. The first lower conductive liner 121 may not be disposed on the first connection insulating layer 130 and 230 on the second active pattern AP2. The first lower conductive liner 121 may not cover each of the second sheet patterns NS2. The first lower conductive liner 121 may not be formed along the perimeter of each of the second sheet patterns NS2.

The first lower conductive liner 121 may include one end of the first lower conductive liner 121 positioned on the upper surface of the first field insulating layer 105 between the first active pattern AP1 and the second active pattern AP2. The first lower conductive liner 121 may define a step on the upper surface of the first field insulating layer 105 between the first active pattern AP1 and the second active pattern AP2.

In a semiconductor device according to some example embodiments, the first gate structure 120 may include the first lower conductive liner 121, and the second gate structure 220 may not include the first lower conductive liner 121. When the first gate structure 120 and the second gate structure 220 are in direct contact, the first gate structure 120 and the second gate structure 220 may be distinguished based on the first lower conductive liner 121.

The boundary surface between the first gate structure 120 and the second gate structure 220 may be positioned at one end of the first lower conductive liner 121. The step defined by the first lower conductive liner 121 may be positioned at the boundary surface between the first gate structure 120 and the second gate structure 220.

The first lower conductive liner 121 may be, for example, a p-type work function film that adjusts a work function. The first lower conductive liner 121 may include, for example, at least one of TiN, TiAlN, TaC, TaN, TiSiN, TaSiN, or TaCN. In a semiconductor device according to some example embodiments, the first lower conductive liner 121 may include TiN or TiAlN.

The first upper conductive liner 122 may be disposed on the first active pattern AP1. The first upper conductive liner 122 may be formed on the first lower conductive liner 121.

When the first lower conductive liner 121 entirely fill a space between the first lower pattern BP1 and the first sheet pattern NS1 and a space between the adjacent first sheet patterns NS1, the first upper conductive liner 122 may extend along an outer profile of the first lower conductive liner 121. The first upper conductive liner 122 may not be formed in the space between the first lower pattern BP1 and the first sheet pattern NS1 and the space between the adjacent first sheet patterns NS1. The first upper conductive liner 122 may not be formed along the perimeter of each of the first sheet patterns NS1.

The second upper conductive liner 222 may be disposed on the second active pattern AP2. The second upper conductive liner 222 may be in direct contact with the first upper conductive liner 122.

The second upper conductive liner 222 may be formed on the second gate insulating layer 230. The second upper conductive liner 222 may surround each of the second sheet patterns NS2. The second upper conductive liner 222 may be disposed along the perimeter of each of the second sheet patterns NS2.

The second upper conductive liner 222 may entirely fill the space between the second lower pattern BP2 and the second sheet pattern NS2 and the space between the adjacent second sheet patterns NS2. For example, when the second lower sheet pattern NS2 and the second upper sheet pattern NS2 that are immediately adjacent in the third direction D3 exist, the second upper conductive liner 222 may entirely fill the space between the upper surface of the second lower sheet pattern NS2 and the bottom surface of the second upper sheet pattern NS2 facing each other in the third direction D3.

The first connection upper conductive liner 122 and 222 may be disposed on the first lower conductive liner 121. For example, the first connection upper conductive liner 122 and 222 may be directly in contact with the first lower conductive liner 121. The first connection upper conductive liner 122 and 222 may be disposed over the first active pattern AP1 and the second active pattern AP2.

Because the first lower conductive liner 121 is disposed between the first upper conductive liner 122 and the first gate insulating layer 130, the first upper conductive liner 122 may not be in contact with the first gate insulating layer 130.

In a semiconductor device according to some example embodiments, the second upper conductive liner 222 may be directly in contact with the second gate insulating layer 230 formed on the second active pattern AP2. The second upper conductive liner 222 may be directly in contact with the second gate insulating layer 230 surrounding the perimeter of the second sheet pattern NS2.

The first connection upper conductive liner 122 and 222 may be, for example, an n-type work function film that controls a work function. The first connection upper conductive liner 122 and 222 may include, for example, one of TiAl, TiAlC, TaAl, or TaAlC. The first upper conductive liner 122 and the second upper conductive liner 222 may be formed at the same level. In a semiconductor device according to some example embodiments, the first connection upper conductive liner 122 and 222 may include TiAl or TiAlC.

The first connection gate filling layer 123 and 223 may be disposed on the first connection upper conductive liner 122 and 222. The first connection gate filling layer 123 and 223 may be disposed over the first active pattern AP1 and the second active pattern AP2. The first gate filling layer 123 may be disposed on the first active pattern AP1. The second gate filling layer 223 may be disposed on the second active pattern AP2.

The first connection gate filling layer 123 and 223 may include, for example, at least one of tungsten (W), aluminum (Al), cobalt (Co), copper (Cu), ruthenium (Ru), nickel (Ni), platinum (Pt), nickel platinum (Ni—Pt), titanium (Ti), or titanium nitride (TiN). The first gate filling layer 123 and the second gate filling layer 223 may be formed at the same level.

Although the first gate filling layer 123 and the second gate filling layer 223 are illustrated as a single layer, the present disclosure is not limited thereto. According to some example embodiments, each of the first gate filling layer 123 and the second gate filling layer 223 may have a structure in which a plurality of conductive layers are stacked.

A first epitaxial pattern 150 may be disposed on the first lower pattern BP1. The first epitaxial pattern 150 may be disposed on at least one side of the first gate structure 120. The first epitaxial pattern 150 may be connected to the first sheet pattern NS1.

A second epitaxial pattern 250 may be disposed on the second lower pattern BP2. The second epitaxial pattern 250 may be disposed on at least one side of the second gate structure 220. The second epitaxial pattern 250 may be connected to the second sheet pattern NS2.

The first epitaxial pattern 150 may be included in the source/drain of the first p-channel transistor 10p using the first sheet pattern NS1 as a channel region. The second epitaxial pattern 250 may be included in the source/drain of the first n-channel transistor 10n using the second sheet pattern NS2 as a channel region.

The first gate spacer 140 may be disposed on a sidewall of the first connection gate structure 50. The first gate spacer 140 may be disposed on the sidewall of the first gate structure 120 and the sidewall of the second gate structure 220.

The first gate spacer 140 may be elongated in the first direction D1. The first connection gate structure 50 may include a long sidewall extending in the first direction D1 and a short sidewall extending in the second direction D2. The first gate spacer 140 may extend along a long sidewall of the first connection gate structure 50. The first gate spacer 140 may not be disposed on the short sidewall of the first connection gate structure 50.

In FIG. 3, the first gate spacer 140 disposed on the second lower pattern BP2 may include an outer spacer 141 and an inner spacer 142. The inner spacer 142 may be disposed between the second sheet patterns NS2 adjacent in the third direction D3. In FIG. 2, the first gate spacer 140 disposed on the first lower pattern BP1 may include only the outer spacer 141 without including the inner spacer 142.

Unlike the illustrated example, in some example embodiments, the first gate spacer 140 disposed above the first lower pattern BP1 and the first gate spacer 140 disposed above the second lower pattern BP2 may both include the outer spacer 141 and the inner spacer 142. Unlike the illustrated example, in some example embodiments, the first gate spacer 140 disposed above the first lower pattern BP1 and the first gate spacer 140 disposed above the second lower pattern BP2 may both include only the outer spacer 141 without including the inner spacer 142.

The outer spacer 141 and the inner spacer 142 may each include, for example, at least one of silicon nitride (SiN), silicon oxynitride (SiON), silicon oxide ($SiO_2$), silicon oxynitride (SiOCN), silicon boron nitride (SiBN), silicon oxyboron nitride (SiOBN), silicon oxycarbide (SiOC), or a combination thereof.

A pair of gate cutting structures GCS may be disposed on the substrate 100. The gate cutting structure GCS may be disposed on the first field insulating layer 105.

The gate cutting structures GCS may be spaced apart from each other in the first direction D1. The first active pattern AP1 and the second active pattern AP2 may be disposed between the gate cutting structures GCS adjacent in the first direction D1. For example, the first lower pattern BP1 and the second lower pattern BP2 may be disposed between the gate cutting structures GCS adjacent in the first direction D1.

The first connection gate structures 50 may be disposed between the gate cutting structures GCS adjacent in the first direction D1. The gate cutting structure GCS may separate the gate structures adjacent in the first direction D1. A short sidewall of the first connection gate structure 50 may face a sidewall of the gate cutting structure GCS.

In a semiconductor device according to some example embodiments, the first gate insulating layer 130, the first lower conductive liner 121, and the first upper conductive liner 122 may extend along the sidewall of the gate cutting structure GCS. The second gate insulating layer 230 and the second upper conductive liner 222 may extend along the sidewall of the gate cutting structure GCS.

As one example, the gate cutting structure GCS may be disposed along the boundary of the standard cell. For example, the gate cutting structure GCS may be a standard cell isolation structure. As another example, the gate cutting structure GCS may be disposed in the SRAM region and may be a gate isolation structure.

The gate cutting structure GCS may include, for example, at least one of silicon nitride (SiN), silicon oxynitride (SiON), silicon oxide ($SiO_2$), silicon oxynitride (SiOCN), silicon boron nitride (SiBN), silicon oxyboron nitride (SiOBN), silicon oxycarbide (SiOC), aluminum oxide (AlO), or a combination thereof. The gate cutting structure GCS is illustrated as a single layer, but is not limited thereto.

The first gate capping pattern 145 may be disposed on the first connection gate structure 50. The first gate capping pattern 145 may be disposed on the first gate structure 120 and the second gate structure 220. The first gate capping pattern 145 may cover an upper surface 123_US of the first gate filling layer and an upper surface 223_US of the second gate filling layer. For example, an upper surface 145_US of the first gate capping pattern may be on the same plane as an upper surface of an interlayer insulating layer 190 and the upper surface of the gate cutting structure GCS.

The first gate capping pattern 145 may include, for example, at least one of silicon nitride (SiN), silicon oxynitride (SiON), silicon oxide (SiO₂), silicon carbonitride (SiCN), silicon oxycarbide (SiOC), silicon oxycarbonitride (SiOCN), or a combination thereof.

The gate shield insulating pattern 160 may be disposed on the first connection gate structure 50. The gate shield insulating pattern 160 may be disposed on the first gate structure 120 and the second gate structure 220.

The gate shield insulating pattern 160 may be disposed on a sidewall of the first gate spacer 140. The gate shield insulating pattern 160 may be disposed on a sidewall of the gate cutting structure GCS. The gate shield insulating pattern 160 may extend along a portion of the sidewall of the first gate spacer 140 and a portion of the sidewall of the gate cutting structure GCS. In a semiconductor device according to some example embodiments, the gate shield insulating pattern 160 may be disposed between the first gate spacer 140 and the first gate capping pattern 145, and between the gate cutting structure GCS and the first gate capping pattern 145. In plan view, the gate shield insulating pattern 160 may have a closed loop shape.

The gate shield insulating pattern 160 may include a first sidewall 160_SW1 and a second sidewall 160_SW2 that are opposite to each other. The first sidewall 160_SW1 of the gate shield insulating pattern 160 may face the first gate capping pattern 145. In another aspect, the first sidewall 160_SW1 of the gate shield insulating pattern 160 may face a long sidewall of the first connection gate structure 50 and a short sidewall of the first connection gate structure 50. The second sidewall 160_SW2 of the gate shield insulating pattern 160 may face the first gate spacer 140 and the gate cutting structure GCS.

The gate shield insulating pattern 160 may extend to the upper surface 145_US of the first gate capping pattern 145. In a semiconductor device according to some example embodiments, the first gate capping pattern 145 does not cover an upper surface 160_US of the gate shield insulating pattern 160. For example, the upper surface 160_US of the gate shield insulating pattern 160 may be on the same plane as the upper surface 145_US of the first gate capping pattern 145.

The gate shield insulating pattern 160 includes an insulating material. The gate shield insulating pattern 160 may include, for example, at least one of silicon nitride (SiN), silicon oxynitride (SiON), silicon carbonitride (SiCN), silicon oxycarbide (SiOC), silicon oxycarbonitride (SiOCN), or a combination thereof.

In FIGS. 4 to 6, the gate shield insulating pattern 160 may cover an upper surface 130_US of the first gate insulating layer 130 and an upper surface 230_US of the second gate insulating layer 230. The gate shield insulating pattern 160 may cover at least a part of an upper surface 121_US of the first lower conductive liner 121. The gate shield insulating pattern 160 may be in contact with the upper surface 130_US of the first gate insulating layer 130, the upper surface 230_US of the second gate insulating layer 230, and the upper surface 121_US of the first lower conductive liner 121.

For example, the gate shield insulating pattern 160 may cover a part of the upper surface 121_US of the first lower conductive liner 121. A thickness t1 of the gate shield insulating pattern 160 may be smaller than the sum of a thickness t21 of the first gate insulating layer 130 and a thickness t22 of the first lower conductive liner 121.

Unlike that illustrated in the drawing, the gate shield insulating pattern 160 may not cover the upper surface 121_US of the first lower conductive liner 121. A bottom surface 160_BS of the gate shield insulating pattern 160 may not be in contact with the upper surface 121_US of the first lower conductive liner 121.

Because the gate shield insulating pattern 160 covers the upper surface 130_US of the first gate insulating layer 130 and the upper surface 230_US of the second gate insulating layer 230, the first gate capping pattern 145 may not be in contact with the first gate insulating layer 130 and the second gate insulating layer 230.

The first gate insulating layer 130 may not extend along a boundary between the gate shield insulating pattern 160 and the first gate spacer 140. The first gate insulating layer 130 may not extend along a boundary between the gate shield insulating pattern 160 and the gate cutting structure GCS. In other words, the gate shield insulating pattern 160 may not be disposed between the first gate insulating layer 130 and the first gate spacer 140, and between the first gate insulating layer 130 and the gate insulating structure GCS. The gate shield insulating pattern 160 may not be disposed between the second gate insulating layer 230 and the first gate spacer 140, and between the second gate insulating layer 230 and the gate insulating structure GCS.

The first upper conductive liner 122 may extend along the first sidewall 160_SW1 of the gate shield insulating pattern 160. The first upper conductive liner 122 may be disposed between the gate shield insulating pattern 160 and the first gate filling layer 123. A portion of the first upper conductive liner 122 may extend between the gate shield insulating pattern 160 and the first gate filling layer 123. The first upper conductive liner 122 may extend to the upper surface 123_US of the first gate filling layer 123. The first upper conductive liner 122 may be in contact with the first sidewall 160_SW1 of the gate shield insulating pattern 160.

The second upper conductive liner 222 may extend along the first sidewall 160_SW1 of the gate shield insulating pattern 160 and the bottom surface 160_BS of the gate shield insulating pattern 160. The second upper conductive liner 222 may extend to the upper surface 223_US of the second gate filling layer 223. The second upper conductive liner 222 may be in contact with the first sidewall 160_SW1 of the gate shield insulating pattern 160.

The first gate capping pattern 145 may cover the upper surface 123_US of the first gate filling layer 123, the upper surface 223_US of the second gate filling layer 223, the upper surface 122_US of the first upper conductive liner 122, and an upper surface 222_US of the second upper conductive liner 222. For example, the first gate capping pattern 145 may be in contact with the first gate filling layer 123, the second gate filling layer 223, the first upper conductive liner 122, and the second upper conductive liner 222.

In FIGS. 5 and 6, the upper surface 130_US of the first gate insulating layer 130, the upper surface 121_US of the first lower conductive liner 121, the upper surface 122_US of the first upper conductive liner 122, the upper surface 230_US of the second gate insulating layer 230, and the upper surface 222_US of the second upper conductive liner 222 may include an inclined surface. Each of the upper surface 123_US of the first gate filling layer 123 and the upper surface 223_US of the second gate filling layer 223 may have a concave shape.

In a semiconductor device according to some example embodiments, the first gate insulating layer 130 and the first lower conductive liner 121 of the first gate structure 120 may be defined as a gate liner pattern. The gate shield insulating pattern 160 may cover at least a part of the upper surfaces 130_US and 121_US of the gate liner pattern. The first upper conductive liner 122 and the first gate filling layer 123 of the first gate structure 120 may be defined as a gate upper pattern. The second gate structure 220 may also be defined similarly to the first gate structure 120.

For example, the upper surface of the gate liner pattern of the first gate structure 120 may include an inclined surface. The upper surface of the gate upper pattern of the first gate structure 120 may have a concave shape.

For example, with respect to an upper surface NS1_US of the first active pattern AP1, the upper surface 130_US of the first gate insulating layer 130 and the upper surface 121_US of the first lower conductive liner 121 is lower than the upper surface 123_US of the first gate filling layer 123 and the upper surface 122_US of the first upper conductive liner 122. For example, when the first active pattern AP1 includes the first sheet pattern NS1, the upper surface NS1_US of the first active pattern may be the upper surface of the sheet pattern disposed on the uppermost portion among the first sheet patterns NS1. With respect to an upper surface NS2_US of the second active pattern AP2, the upper surface 230_US of the second gate insulating layer is lower than the upper surface 223_US of the second gate filling layer 223 and the upper surface 222_US of the second upper conductive liner 222.

The gate shield insulating pattern 160 may cover at least a part of the upper surface 121_US of the first lower conductive liner 121. That is, with respect to the upper surface NS1_US of the first active pattern AP1, the upper surface 130_US of the first gate insulating layer 130 and the upper surface 230_US of the second gate insulating layer 230 may be at a same level as the bottom surface of the gate shield insulating pattern 160. In some example embodiments, with respect to the upper surface NS1_US of the first active pattern AP1, the upper surface 130_US of the first gate insulating layer 130 and the upper surface 230_US of the second gate insulating layer 230 may be lower than the bottom surface 160_BS of the gate shield insulating pattern 160.

In FIG. 5, a height H11 from the upper surface NS1_US of the first active pattern AP1 to the upper surface 130_US of the first gate insulating layer 130 is smaller than a height H14 from the upper surface NS1_US of the first active pattern AP1 to the upper surface 123_US of the first gate filling layer 123 and a height H13 from the upper surface NS1_US of the first active pattern AP1 to the upper surface 122_US of the first upper conductive liner 122. The height H11 from the upper surface NS1_US of the first active pattern AP1 to the upper surface 130_US of the first gate insulating layer 130 is greater than a height H12 from the upper surface NS1_US of the first active pattern AP1 to the upper surface 121_US of the first lower conductive liner 121. The height H14 from the upper surface NS1_US of the first active pattern AP1 to the upper surface 123_US of the first gate filling layer 123 is smaller than the height H13 from the upper surface NS1_US of the first active pattern AP1 to the upper surface 122_US of the first upper conductive liner 122. Here, "the height of the upper surface" may mean a height from the upper surface of the active pattern to the lowest portion of the upper surface. Although not illustrated, of course, the height relation in the first gate structure 120 in FIG. 5 may also be applied to the second gate structure 220 illustrated in FIG. 6.

The upper surfaces 130_US and 121_US of the gate liner pattern of the first gate structure 120 may have a first step SP1. The upper surfaces 122_US and 123_US of the gate upper pattern of the first gate structure 120 may have a second step SP2. The upper surface 123_US of the first gate filling layer may have a third step SP3. Here, "the step of the upper surface" may be a height difference between the highest portion of the upper surface and the lowest portion of the upper surface with respect to the upper surface of the active pattern.

The step SP1 of the upper surfaces 130_US and 121_US of the gate liner pattern is smaller than the step SP2 of the upper surfaces 122_US and 123_US of the gate upper pattern. As one example, the step SP1 of the upper surfaces 130_US and 121_US of the gate liner pattern may be smaller than the step SP3 of the upper surface 123_US of the first gate filling layer. As another example, the step SP1 of the upper surfaces 130_US and 121_US of the gate liner pattern may be the same as the step SP3 of the upper surface 123_US of the first gate filling layer. As another example, the step SP1 of the upper surfaces 130_US and 121_US of the gate liner pattern may be greater than the step SP3 of the upper surface 123_US of the first gate filling layer.

Unlike that illustrated in the drawing, as one example, the step SP1 of the upper surfaces 130_US and 121_US of the gate liner pattern may be the same as the step SP2 of the upper surfaces 122_US and 123_US of the gate upper pattern. As another example, the step SP1 of the upper surfaces 130_US and 121_US of the gate liner pattern may be greater than the step SP2 of the upper surfaces 122_US and 123_US of the gate upper pattern.

A first source/drain contact 180 may be disposed on the first epitaxial pattern 150. A first silicide layer 155 may be further disposed between the first source/drain contact 180 and the first epitaxial pattern 150.

A second source/drain contact 280 may be disposed on the second epitaxial pattern 250. A second silicide layer 255 may be further disposed between the second source/drain contact 280 and the second epitaxial pattern 250.

Each of the first source/drain contact 180 and the second source/drain contact 280 may contain a conductive material, for example, at least one of metal, metal nitride, metal carbonitride, a two-dimensional material (2D) material, or a conductive semiconductor material. Although it is illustrated that each of the first source/drain contact 180 and the second source/drain contact 280 is a single layer for simplicity of description, the present disclosure is not limited thereto. In one example, the first source/drain contact 180 and the second source/drain contact 280 may include a contact barrier layer and a contact filling layer that fills the space defined by the contact barrier layer. In another example, the first source/drain contact 180 and the second source/drain contact 280 may include only a contact filling layer without a contact barrier layer. Each of the first silicide layer 155 and the second silicide layer 255 may contain, for example, a metal silicide material.

As the heights of the first gate structure 120 and the second gate structure 220 are lowered in portions adjacent to the source/drain contacts 180 and 280, the gate shield insulating pattern 160 may mitigate or prevent a short circuit between the source/drain contacts 180 and 280 and the gate structures 120 and 220. In addition, as the heights of the first gate structure 120 and the second gate structure 220 are lowered in portions adjacent to the source/drain contacts 180 and 280, the capacitance between the source/drain contacts 180 and 280 and the gate structures 120 and 220 may decrease.

The interlayer insulating layer 190 may be disposed on the first epitaxial pattern 150 and the second epitaxial pattern 250. The interlayer insulating layer 190 may include, for example, silicon oxide, silicon nitride, silicon oxynitride, flowable oxide (FOX), tonen silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SiLK, polyimide, a porous polymeric material, or a combination thereof. However, the present disclosure is not limited thereto.

Although not illustrated, a wire line extending in the second direction D2 along the gate cutting structure GCS may be disposed on the gate cutting structure GCS.

FIGS. 7 to 11 are diagrams each illustrating a semiconductor device according to some example embodiments. For simplicity of description, the following description will focus on differences from the description with reference to FIGS. 1 to 6. For reference, FIGS. 7 to 11 are enlarged views of part P of FIG. 2, respectively. Referring to FIGS. 7 to 11, the enlarged view related to part Q of FIG. 3 may be easily inferred.

Figure 7:
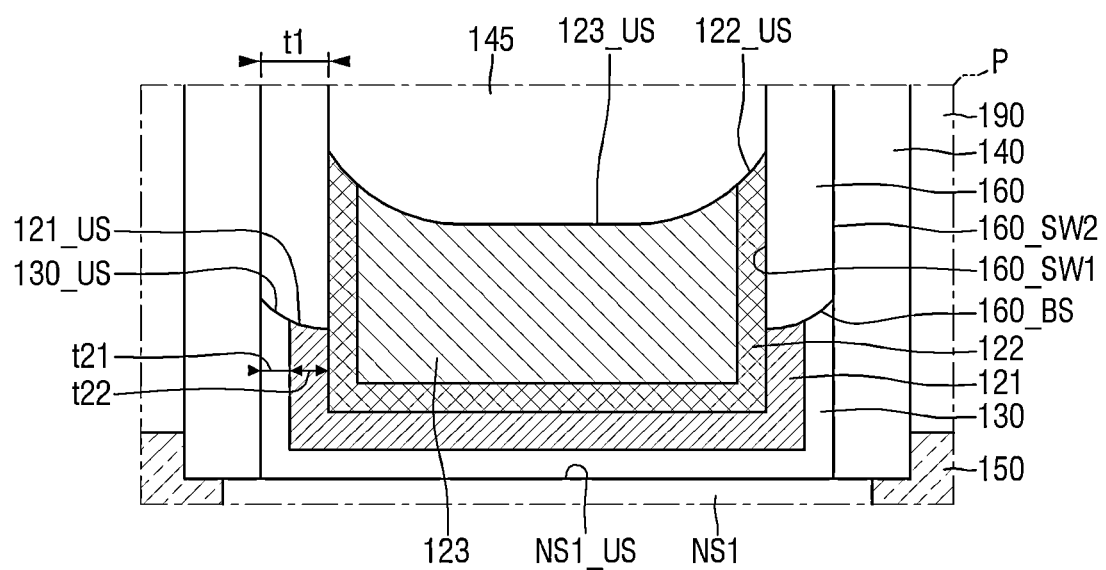
FIGS. 7 to 11 are diagrams each illustrating a semiconductor device according to some example embodiments.
Figure 8:
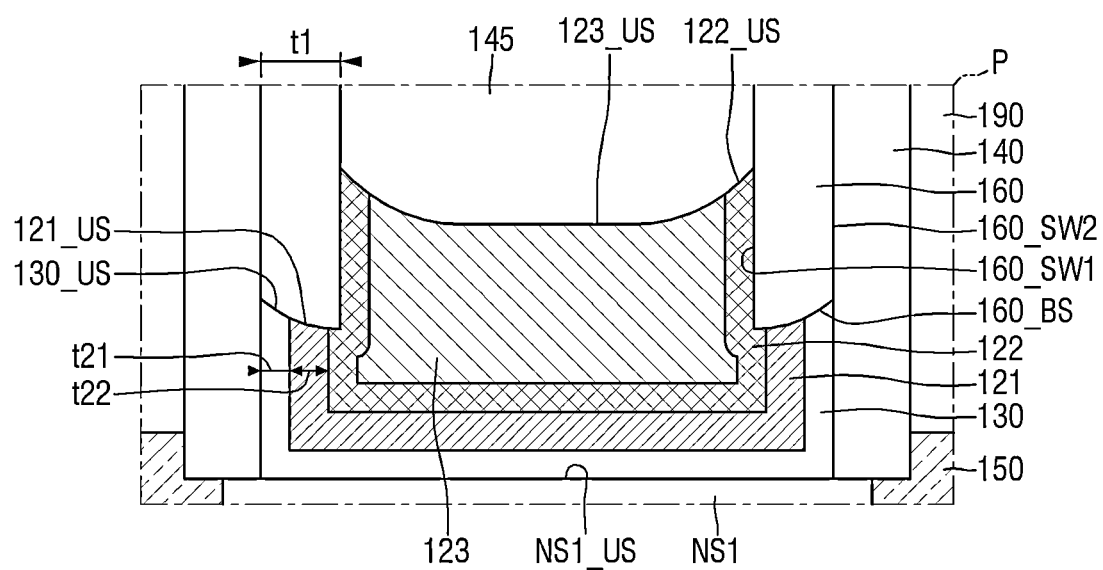

Referring to FIGS. 7 and 8, in a semiconductor device according to some example embodiments, the gate shield insulating pattern 160 may entirely cover the upper surface 121_US of the first lower conductive liner 121.

In FIG. 7, the thickness t1 of the gate shield insulating pattern 160 may be equal to the sum of the thickness t21 of the first gate insulating layer 130 and the thickness t22 of the first lower conductive liner 121.

In FIG. 8, the thickness t1 of the gate shield insulating pattern 160 may be greater than the sum of the thickness t21 of the first gate insulating layer 130 and the thickness t22 of the first lower conductive liner 121. In this case, the first upper conductive liner 122 may cover a part of the bottom surface 160_BS of the gate shield insulating pattern 160.

Figure 9:
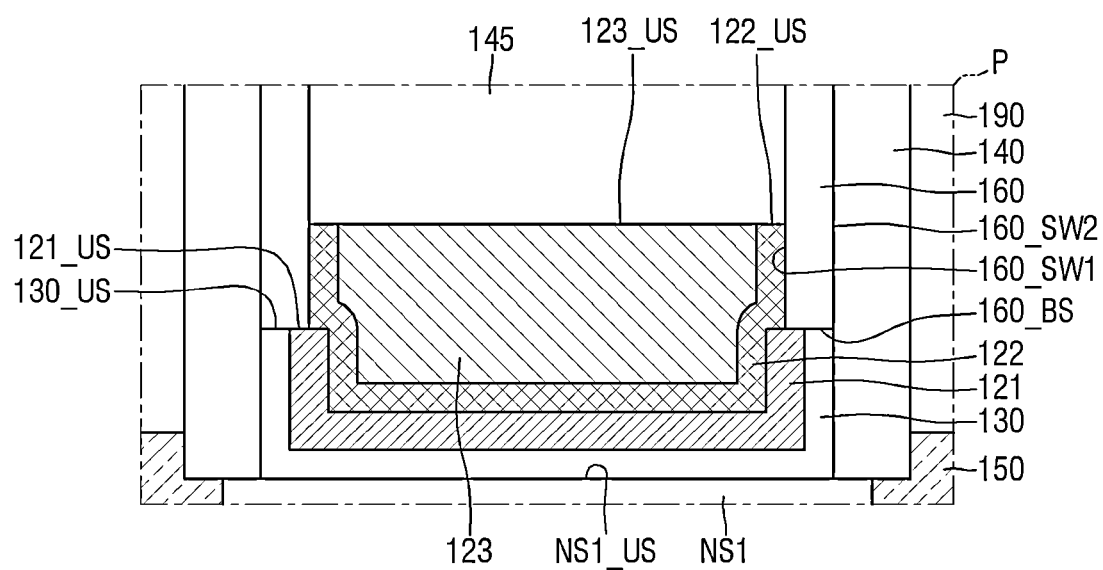

Referring to FIG. 9, in a semiconductor device according to some example embodiments, the upper surface 130_US of the first gate insulating layer and the upper surface 121_US of the first lower conductive liner 121 may be flat with respect to the upper surface NS1_US of the first active pattern.

The upper surface 122_US of the first upper conductive liner 122 and the upper surface 123_US of the first gate filling layer 123 may be flat with respect to the upper surface NS1_US of the first active pattern.

Unlike that illustrated in the drawing, the upper surface 122_US of the first upper conductive liner 122 may include an inclined surface, and the upper surface 123_US of the first gate filling layer 123 may have a concave shape.

Figure 10:
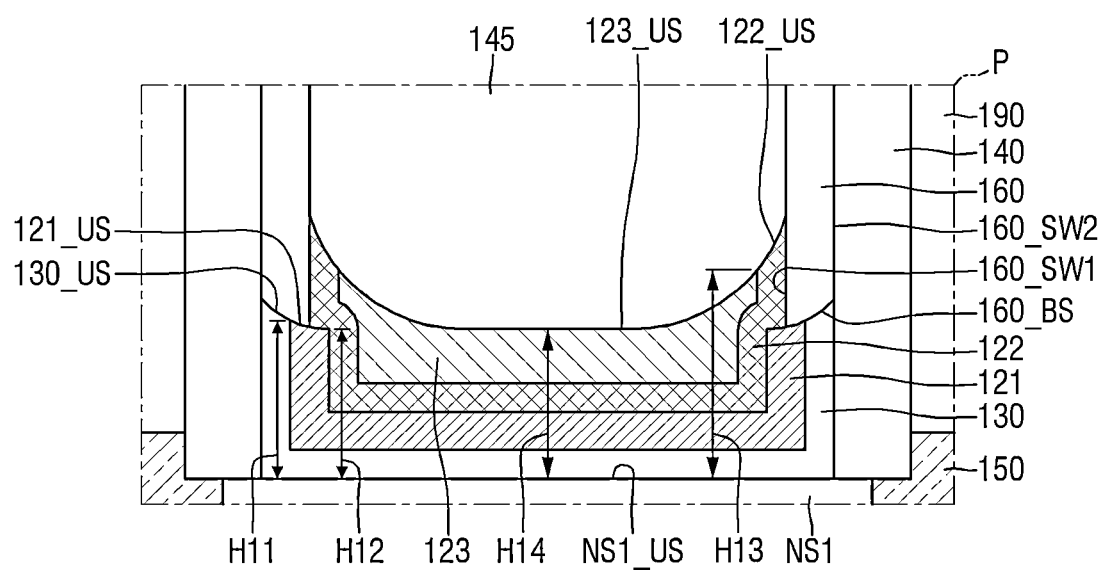

Referring to FIG. 10, in a semiconductor device according to some example embodiments, the height H12 from the upper surface NS1_US of the first active pattern AP1 to the upper surface 121_US of the first lower conductive liner 121 may be the same as the height H14 from the upper surface NS1_US of the first active pattern AP1 to the upper surface 123_US of the first gate filling layer.

The height H11 from the upper surface NS1_US of the first active pattern AP1 to the upper surface 130_US of the first gate insulating layer 130 is greater than the height H14 from the upper surface NS1_US of the first active pattern AP1 to the upper surface 123_US of the first gate filling layer 123. The height H13 from the upper surface NS1_US of the first active pattern AP1 to the upper surface 122_US of the first upper conductive liner 122 is greater than the height H12 from the upper surface NS1_US of the first active pattern AP1 to the upper surface 121_US of the first lower conductive liner 121.

Figure 11:
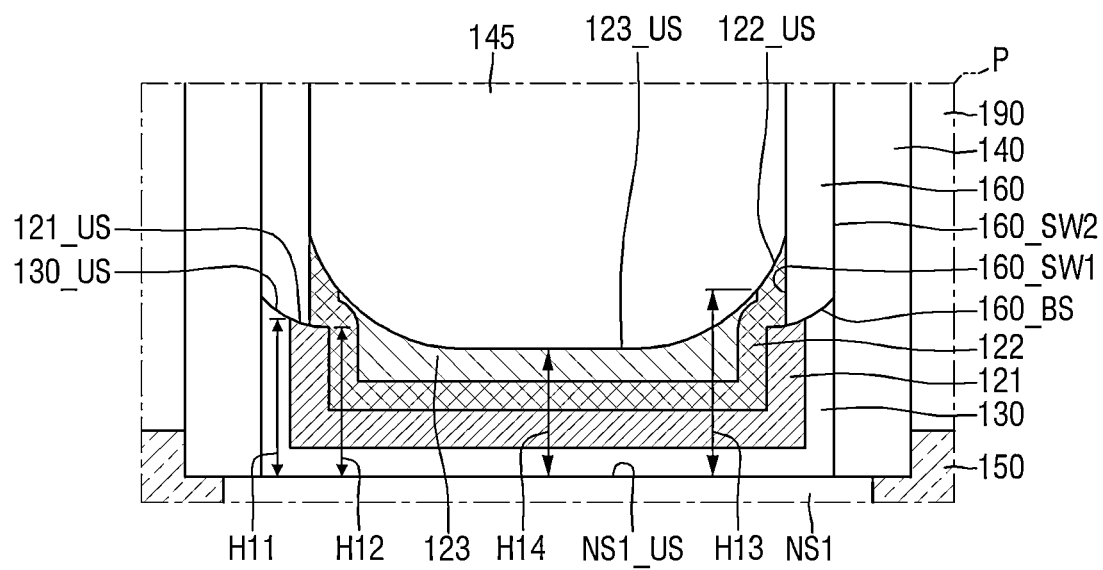

Referring to FIG. 11, in a semiconductor device according to some example embodiments, the height H12 from the upper surface NS1_US of the first active pattern AP1 to the upper surface 121_US of the first lower conductive liner 121 is greater than the height H14 from the upper surface NS1_US of the first active pattern AP1 to the upper surface 123_US of the first gate filling layer 123.

As one example, the height H13 from the upper surface NS1_US of the first active pattern AP1 to the upper surface 122_US of the first upper conductive liner 122 may be greater than the height H12 from the upper surface NS1_US of the first active pattern AP1 to the upper surface 121_US of the first lower conductive liner 121. As another example, the height H13 from the upper surface NS1_US of the first active pattern AP1 to the upper surface 122_US of the first upper conductive liner 122 may be the same as the height H12 from the upper surface NS1_US of the first active pattern AP1 to the upper surface 121_US of the first lower conductive liner 121. As yet another example, the height H13 from the upper surface NS1_US of the first active pattern AP1 to the upper surface 122_US of the first upper conductive liner 122 may be smaller than the height H12 from the upper surface NS1_US of the first active pattern AP1 to the upper surface 121_US of the first lower conductive liner 121.

Figure 12:
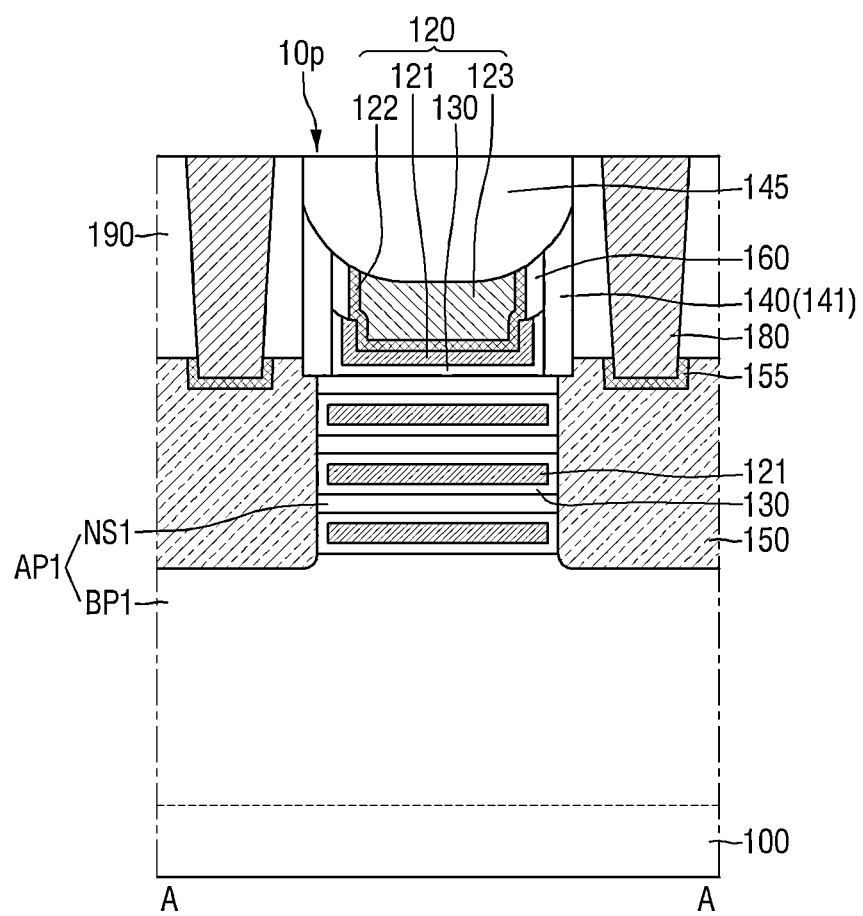
FIGS. 12 to 14 are diagrams illustrating a semiconductor device according to some example embodiments.
Figure 13:
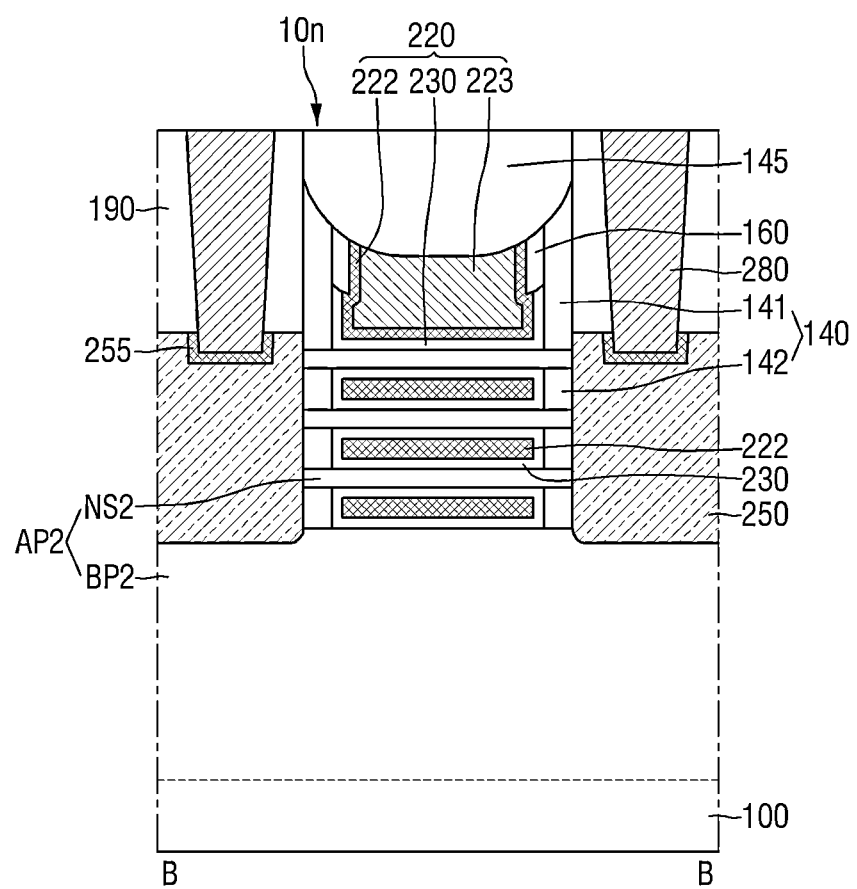
Figure 14:
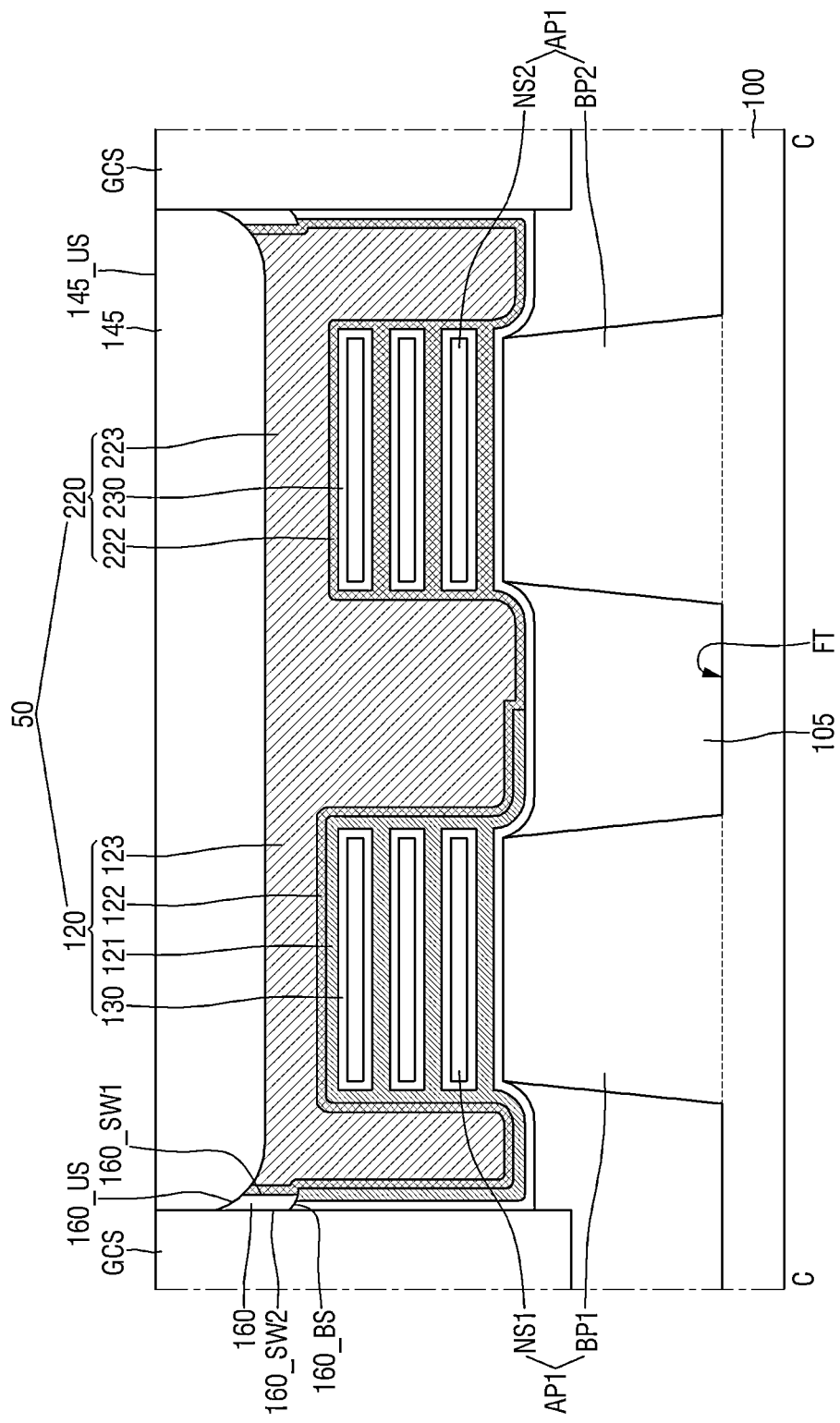
Figure 15:
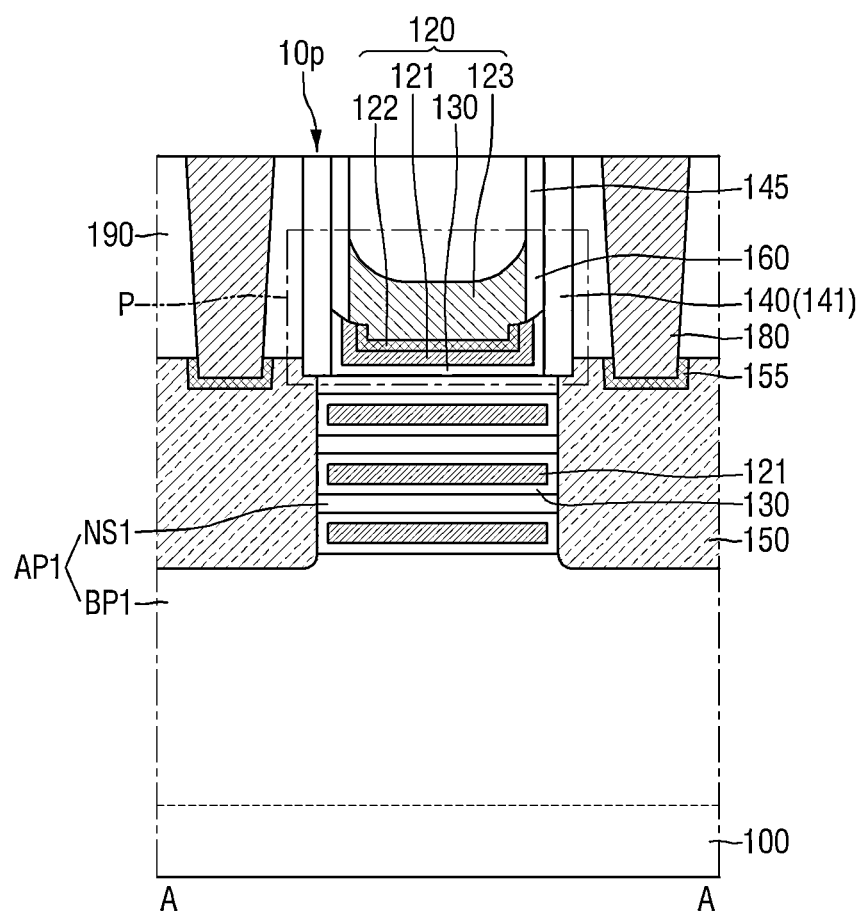
FIGS. 15 to 19 are diagrams illustrating a semiconductor device according to some example embodiments.
Figure 16:
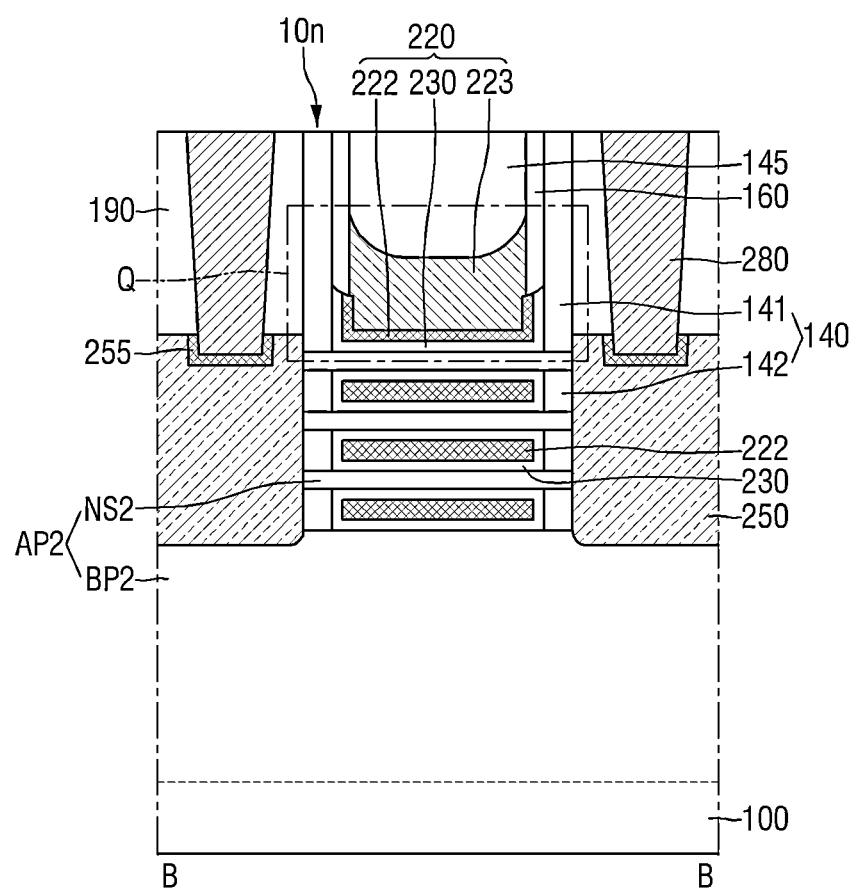
Figure 17:
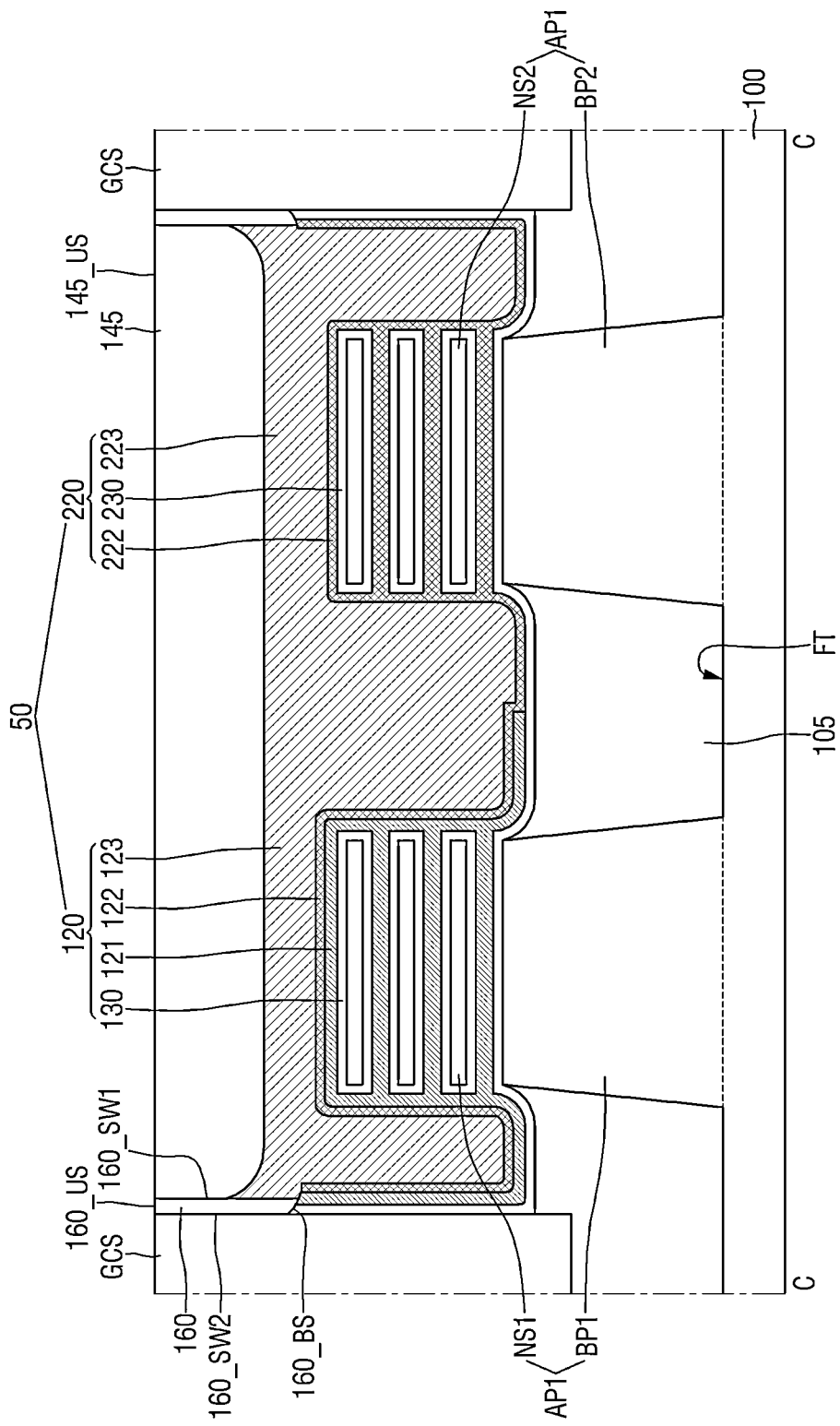

FIGS. 12 to 14 are diagrams illustrating a semiconductor device according to some example embodiments. For simplicity of description, the following description will focus on differences from the description with reference to FIGS. 1 to 6.

Referring to FIGS. 12 to 14, in a semiconductor device according to some example embodiments, the first gate capping pattern 145 may cover the upper surface 160_US of the gate shield insulating pattern 160. The first gate capping pattern 145 may be in contact with the upper surface 160_US of the gate shield insulating pattern 160.

The gate shield insulating pattern 160 does not extend to the upper surface 145_US of the first gate capping pattern 145. The upper surface 160_US of the gate shield insulating pattern 160 is lower than the upper surface 145_US of the first gate capping pattern 145.

The first gate capping pattern 145 may cover the upper surface of the first gate spacer 140.

During the process of fabricating the first connection gate structure 50, a part of the gate shield insulating pattern 160 and a part of the first gate spacer 140 may be etched, so that the upper surface 160_US of the gate shield insulating pattern 160 may be lowered. Thereafter, the first gate capping pattern 145 may cover the upper surface 160_US of the etched gate shield insulating pattern 160.

FIGS. 15 to 19 are diagrams illustrating a semiconductor device according to some example embodiments. For simplicity of description, the following description will focus on differences from the description with reference to FIGS. 1 to 6.

Referring to FIGS. 15 to 19, in a semiconductor device according to some example embodiments, with respect to the upper surface NS1_US of the first active pattern AP1, the upper surface 122_US of the first upper conductive liner 122 may be lower than the bottom surface 160_BS of the gate shield insulating pattern 160. The upper surface 222_US of the second upper conductive liner 222 may be lower than the bottom surface 160_BS of the gate shield insulating pattern 160 with respect to the upper surface NS2_US of the second active pattern AP2.

The first upper conductive liner 122 does not extend along the first sidewall 160_SW1 of the gate shield insulating pattern 160. The second upper conductive liner 222 does not extend along the first sidewall 160_SW1 of the gate shield insulating pattern 160. The first upper conductive liner 122 and the second upper conductive liner 222 do not cover the first sidewall 160_SW1 of the gate shield insulating pattern.

The first upper conductive liner 122 is not disposed between the gate shield insulating pattern 160 and the first gate filling layer 123. The first gate filling layer 123 may be in contact with the first sidewall 160_SW1 of the gate shield insulating pattern 160. The first upper conductive liner 122 does not extend to the upper surface 123_US of the first gate filling layer 123.

The second upper conductive liner 222 is not disposed between the gate shield insulating pattern 160 and the second gate filling layer 223. The second gate filling layer 223 may be in contact with the first sidewall 160_SW1 of the gate shield insulating pattern 160. The second upper conductive liner 222 does not extend to the upper surface 223_US of the second gate filling layer 223.

The first gate capping pattern 145 may be in contact with the first gate filling layer 123 and the second gate filling layer 223, but may not be in contact with the first upper conductive liner 122 and the second upper conductive liner 222.

In a semiconductor device according to some example embodiments, the first gate insulating layer 130, the first lower conductive liner 121, and the first upper conductive liner 122 of the first gate structure 120 may be defined as a gate liner pattern. The gate shield insulating pattern 160 may cover at least a part of the upper surfaces 130_US, 121_US, and 122_US of the gate liner pattern. The first gate filling layer 123 of the first gate structure 120 may be defined as a gate upper pattern. The second gate structure 220 may also be defined similarly to the first gate structure 120.

With respect to the upper surface NS1_US of the first active pattern AP1, the upper surface 130_US of the first gate insulating layer 130, the upper surface 121_US of the first lower conductive liner 121, and the upper surface 122_US of the first upper conductive liner 122 are lower than the upper surface 123_US of the first gate filling layer 123. With respect to the upper surface NS2_US of the second active pattern AP2, the upper surface 230_US of the second gate insulating layer 230 and the upper surface 222_US of the second upper conductive liner 222 are lower than the upper surface 223_US of the second gate filling layer 223.

Figure 18:
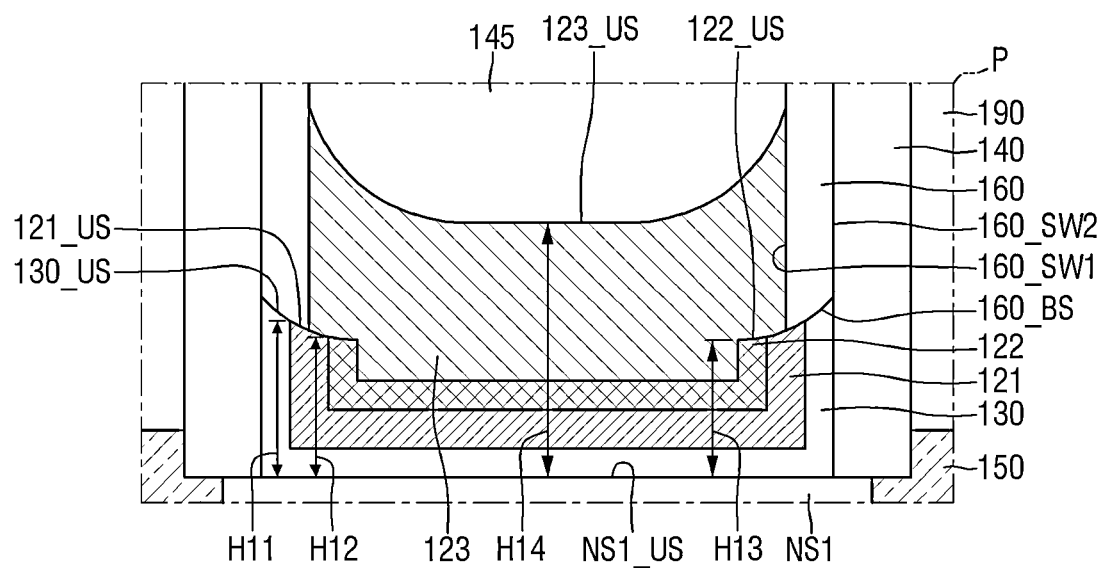
Figure 19:
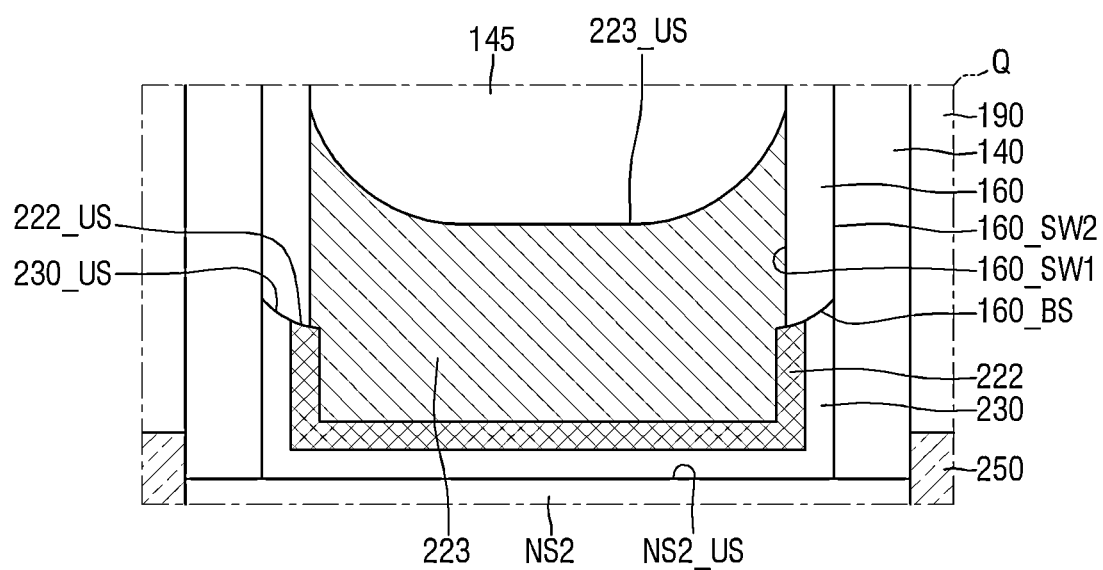

In FIG. 18, the height H13 from the upper surface NS1_US of the first active pattern AP1 to the upper surface 122_US of the first upper conductive liner 122 is smaller than the height H14 from the upper surface NS1_US of the first active pattern AP1 to the upper surface 123_US of the first gate filling layer 123. The height H13 from the upper surface NS1_US of the first active pattern AP1 to the upper surface 122_US of the first upper conductive liner 122 is smaller than the height H12 from the upper surface NS1_US of the first active pattern AP1 to the upper surface 121_US of the first lower conductive liner 121. Although not illustrated, of course, the height relation in the first gate structure 120 in FIG. 18 may also be applied to the second gate structure 220 illustrated in FIG. 19.

Figure 20:
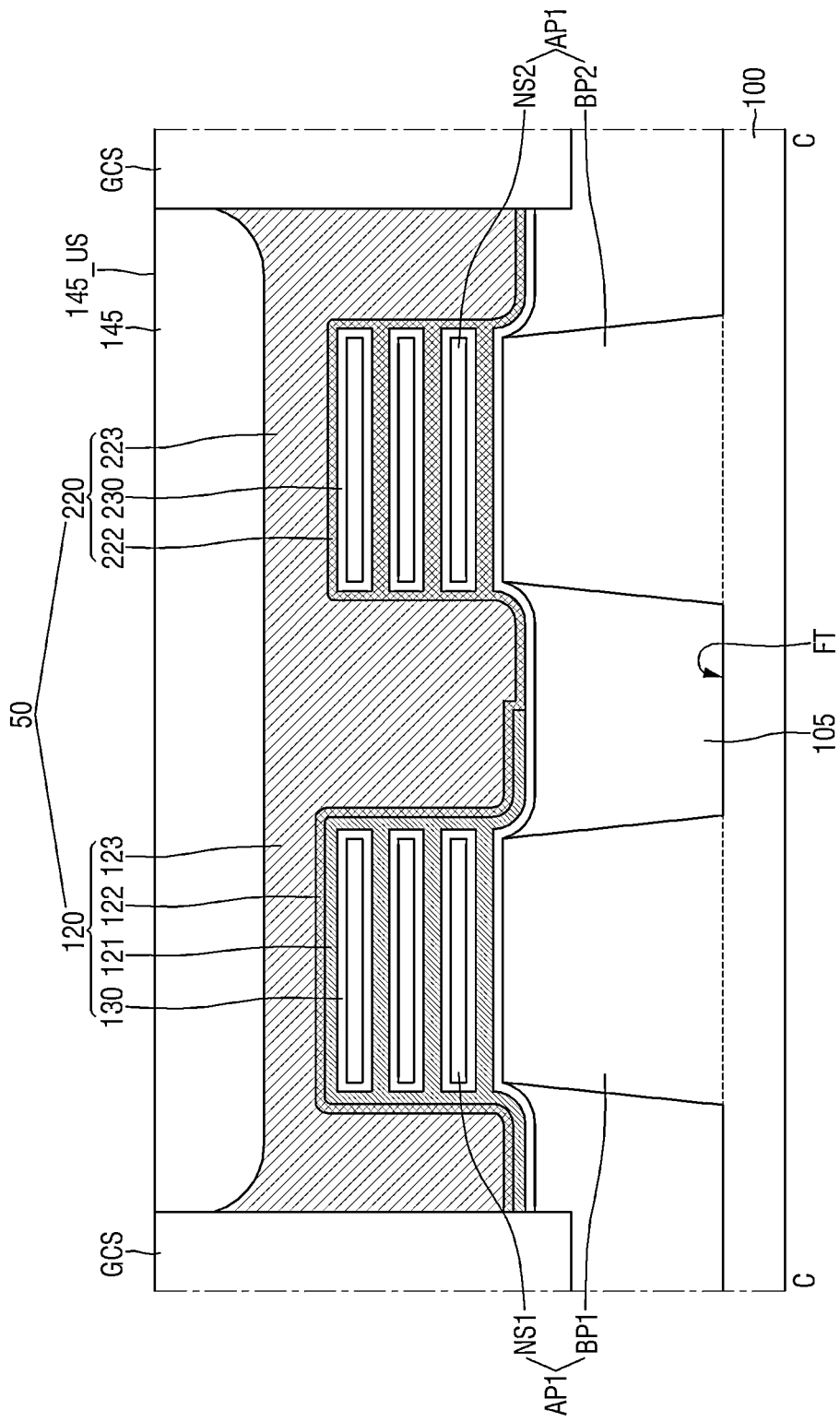
FIG. 20 is a diagram illustrating a semiconductor device according to some example embodiments.
Figure 21:
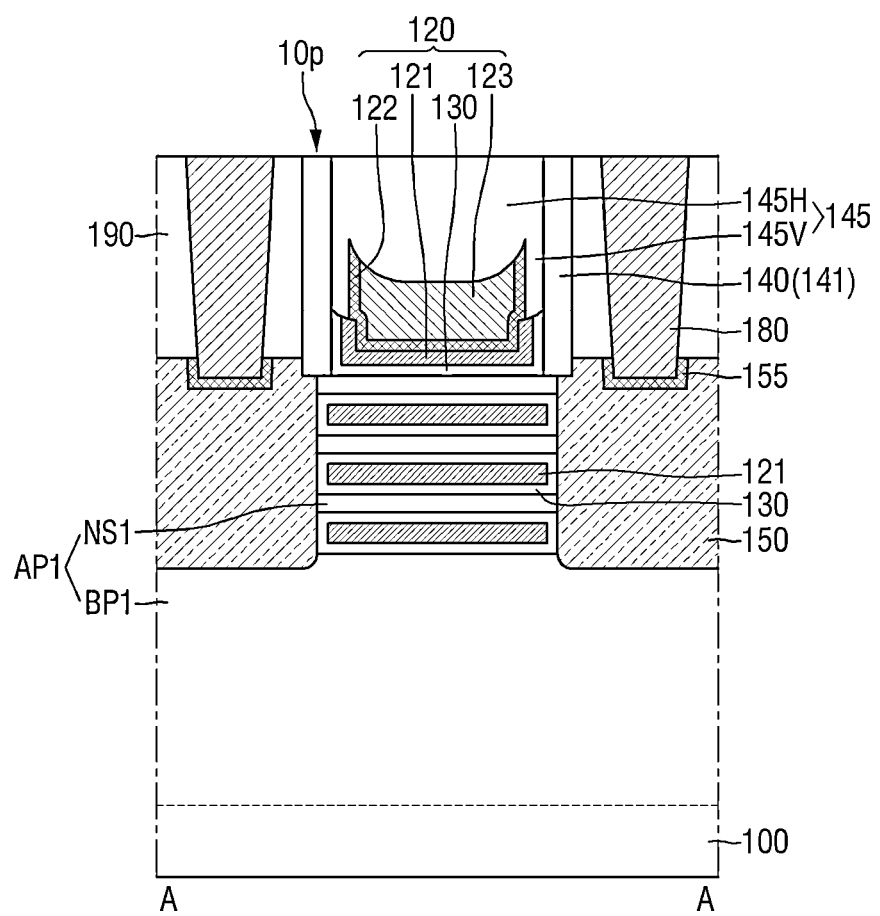
FIGS. 21 to 24 are diagrams illustrating a semiconductor device according to some example embodiments.
Figure 22:
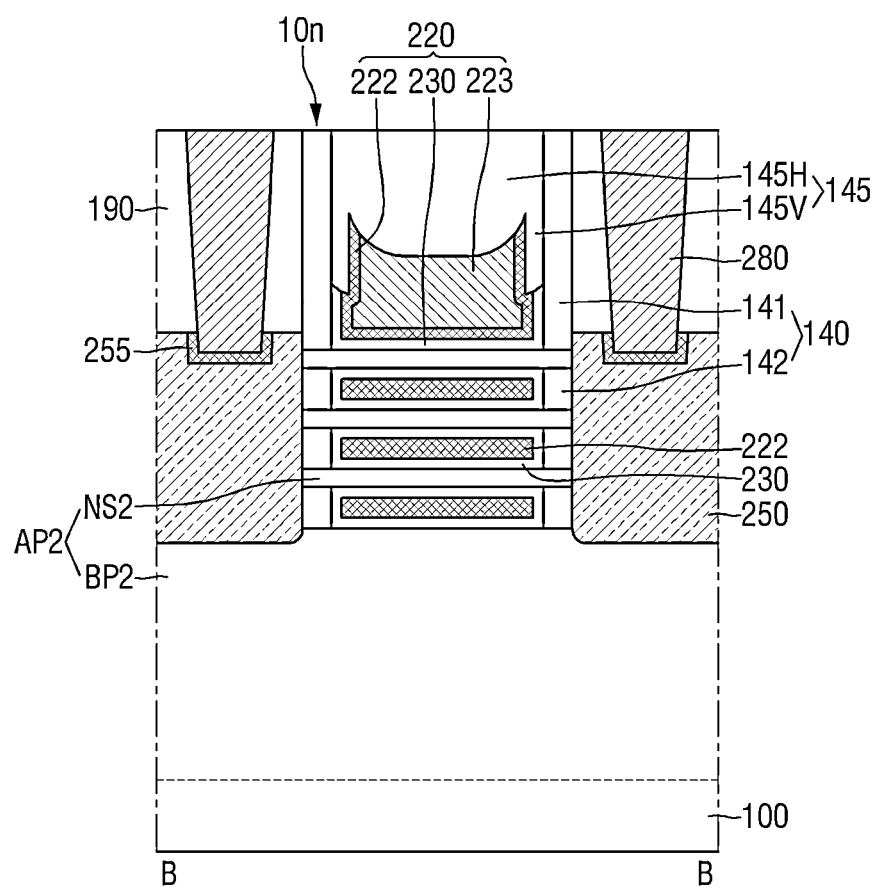

FIG. 20 is a diagram illustrating a semiconductor device according to some example embodiments. For simplicity of description, the following description will focus on differences from the description with reference to FIGS. 1 to 6.

Referring to FIG. 20, in a semiconductor device according to some example embodiments, the first gate insulating layer 130, the first lower conductive liner 121, and the first upper conductive liner 122 do not extend along the sidewall of the gate cutting structure GCS. The second gate insulating layer 230 and the second upper conductive liner 222 do not extend along the sidewall of the gate cutting structure GCS.

The gate shield insulating pattern 160 is not disposed between the gate cutting structure GCS and the first gate capping pattern 145. Meanwhile, the gate shield insulating pattern 160 is disposed between the first gate spacer 140 and the first gate capping pattern 145. In plan view, the gate shield insulating pattern 160 may have a shape of lines spaced apart from each other in the second direction D2 and extending in the first direction D1.

FIGS. 21 to 24 are diagrams illustrating a semiconductor device according to some example embodiments. For simplicity of description, the following description will focus on differences from the description with reference to FIGS. 1 to 6.

Referring to FIGS. 21 to 24, in a semiconductor device according to some example embodiments, the first gate capping pattern 145 may be in contact with the first gate insulating layer 130, the second gate insulating layer 230, and the first lower conductive liner 121.

In other words, the first gate capping pattern 145 may cover the upper surface 130_US of the first gate insulating layer 130 in FIG. 5, the upper surface 230_US of the second gate insulating layer 230 in FIG. 6, and the upper surface 121_US of the first lower conductive liner 121 in FIG. 5. That is, the first gate capping pattern 145 may cover at least a part of the upper surfaces 130_US and 121_US of the gate liner pattern 121.

The first gate capping pattern 145 may include a horizontal portion 145H and a vertical portion 145V. The horizontal portion 145H of the first gate capping pattern 145 may cover the upper surface of the first gate filling layer 123 and the upper surface of the second gate filling layer 223. The vertical portion 145V of the first gate capping pattern 145 may extend between the first gate spacer 140 and the first upper conductive liner 122. The vertical portion 145V of the first gate capping pattern 145 may extend between the first gate spacer 140 and the second upper conductive liner 222. The vertical portion 145V of the first gate capping pattern 145 may extend between the gate cutting structure GCS and the first upper conductive liner 122.

Figure 23:
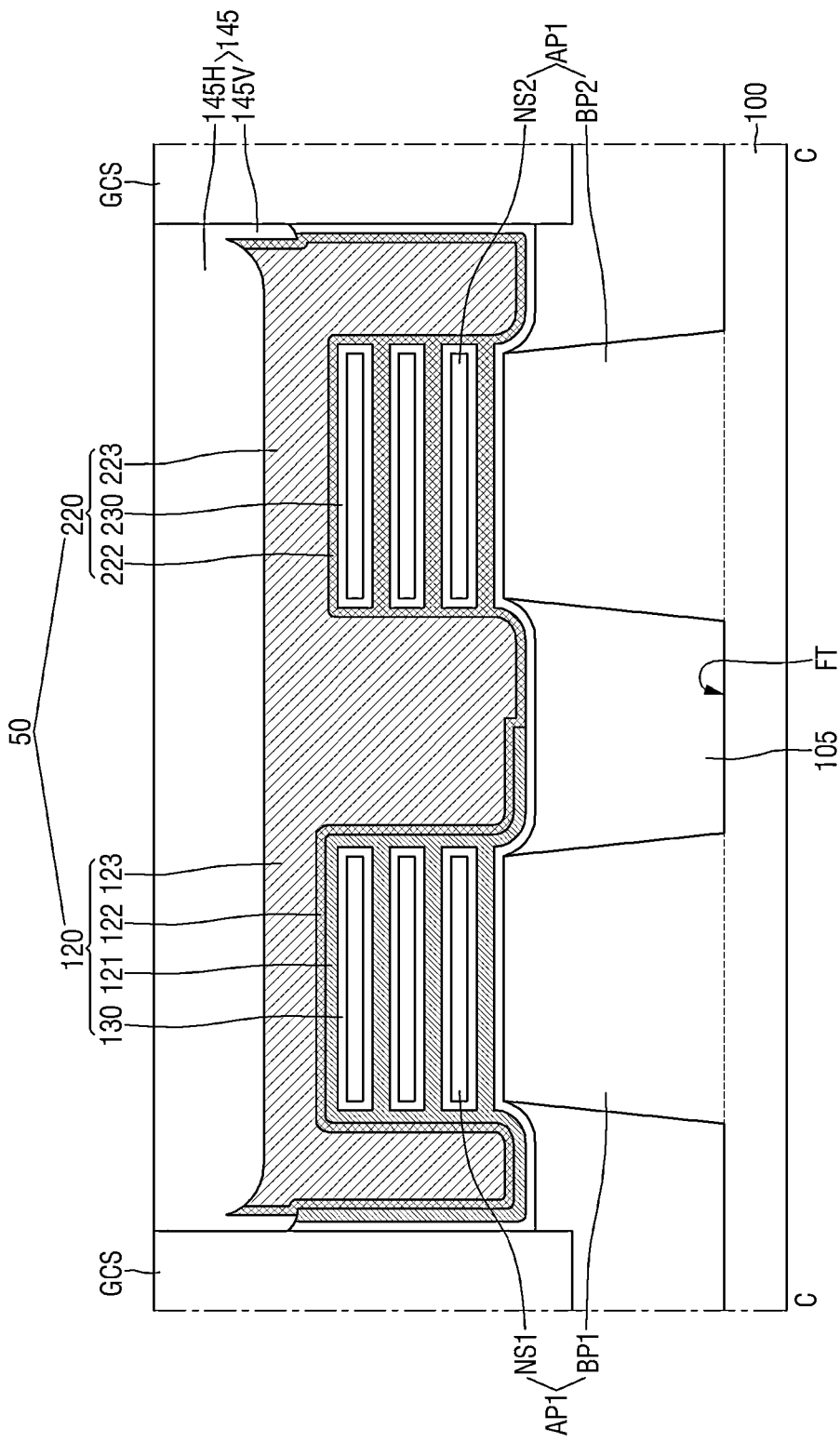

In FIG. 23, a space between the gate cutting structure GCS and the first upper conductive liner 122 may be entirely filled by the first gate capping pattern 145.

Figure 24:
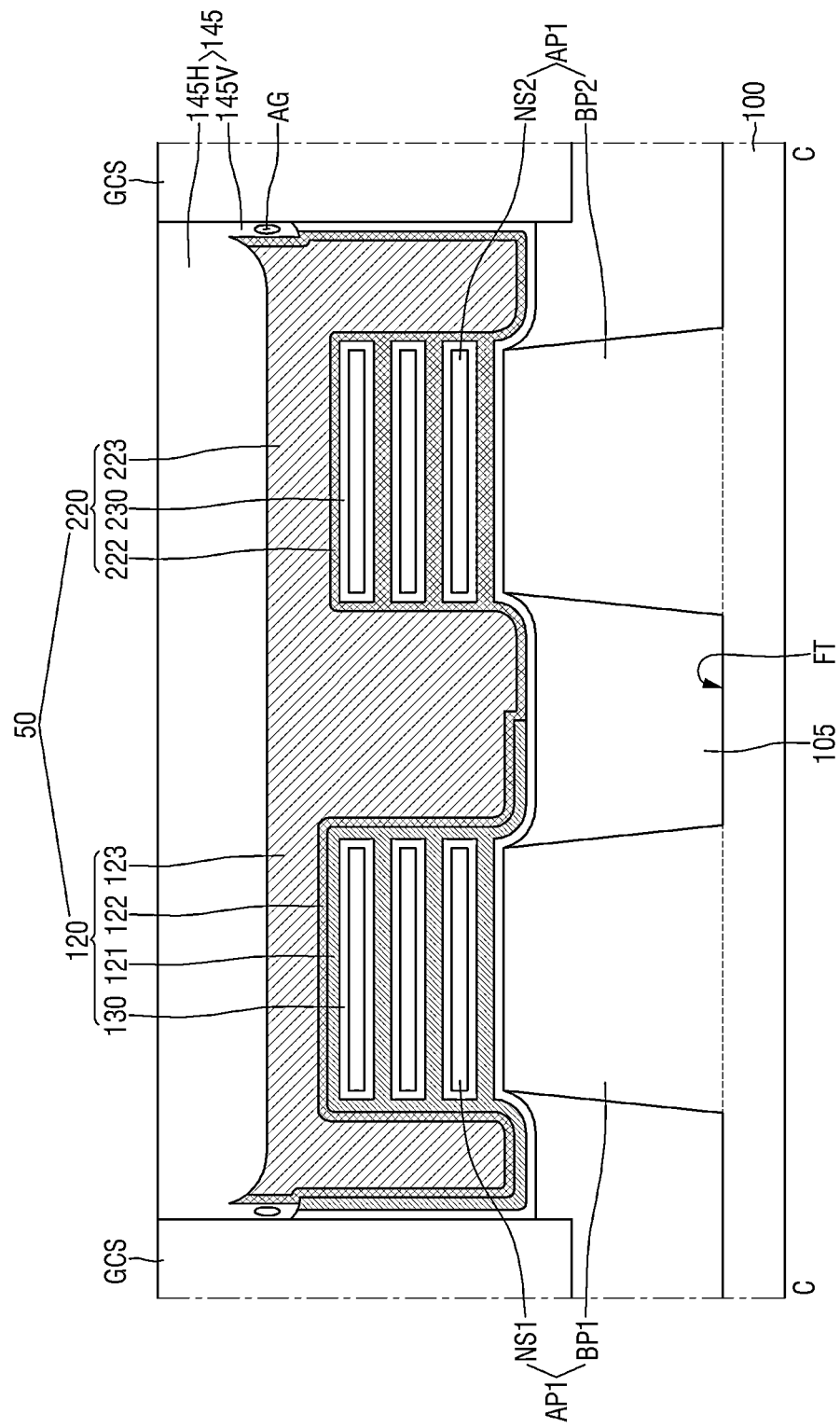

In FIG. 24, the vertical portion 145V of the first gate capping pattern 145 may include an air gap AG. Although not illustrated, the vertical portion 145V of the first gate capping pattern between the first gate spacer 140 and the first upper conductive liner 122 may include the air gap AG. The vertical portion 145V of the first gate capping pattern 145 between the first gate spacer 140 and the second upper conductive liner 222 may include the air gap AG.

Figure 25:
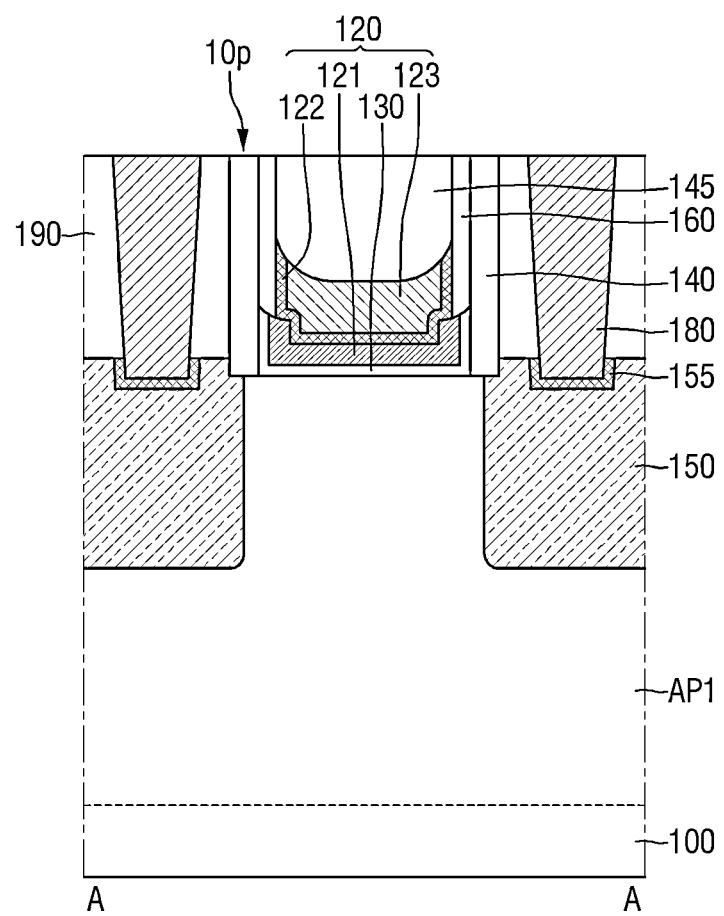
FIGS. 25 to 27 are diagrams illustrating a semiconductor device according to some example embodiments.
Figure 26:
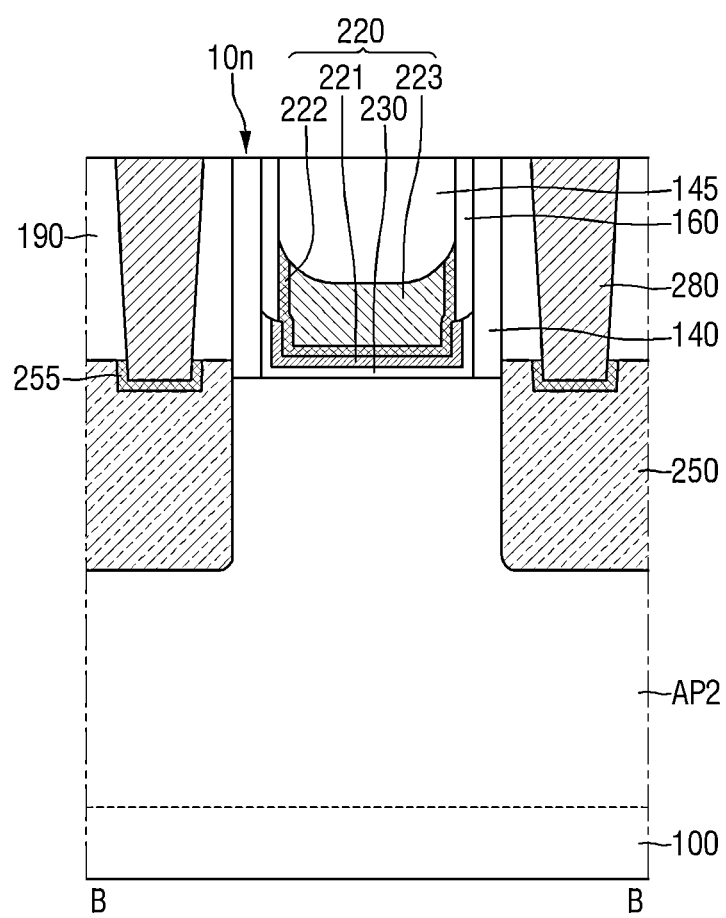
Figure 27:
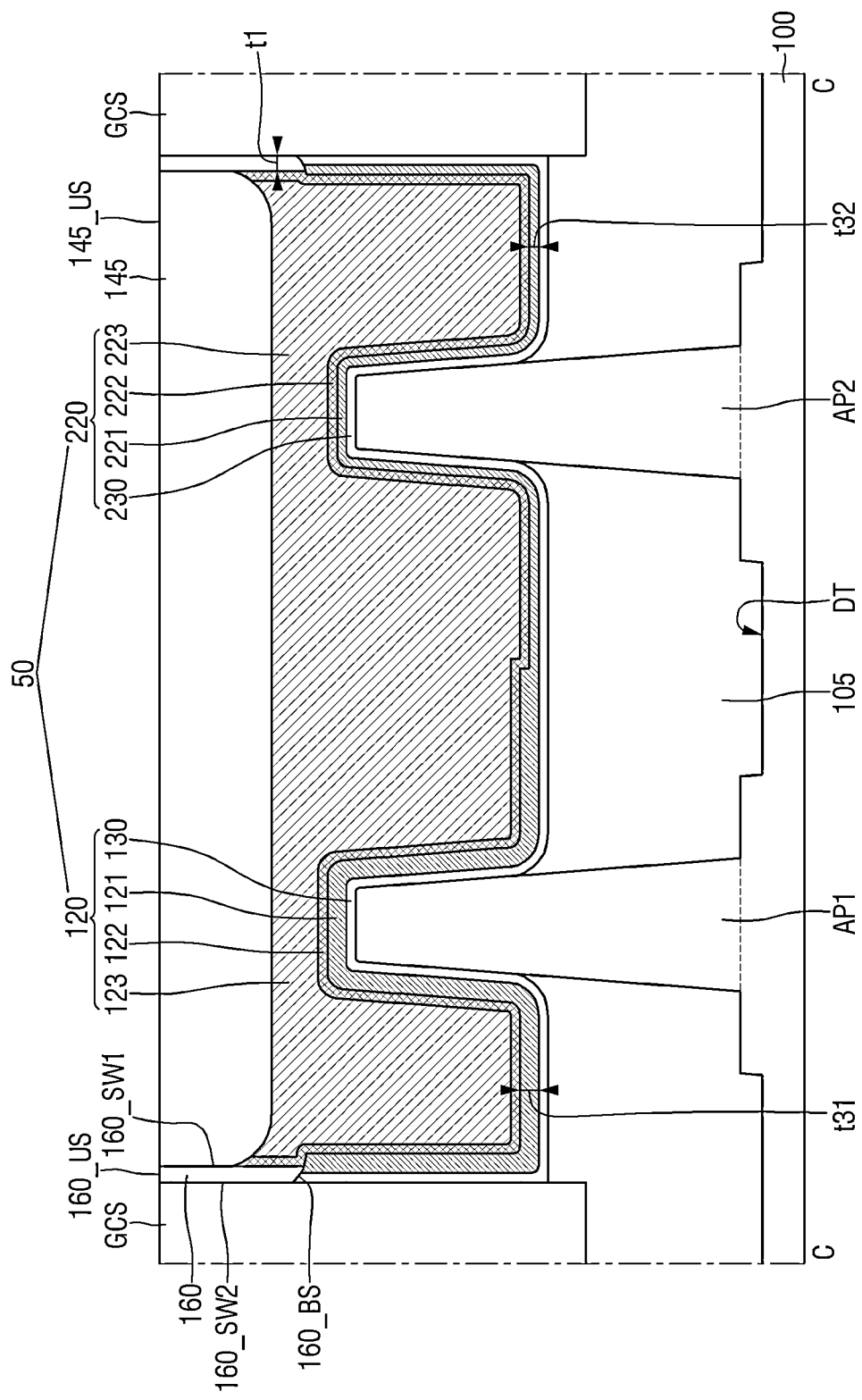

FIGS. 25 to 27 are diagrams illustrating a semiconductor device according to some example embodiments. For simplicity of description, the following description will focus on differences from the description with reference to FIGS. 1 to 6.

Referring to FIGS. 25 to 27, in a semiconductor device according to some example embodiments, the second gate structure 220 may further include a second lower conductive liner 221 disposed between the second gate insulating layer 230 and the second upper conductive liner 222. Further, the first active pattern AP1 and the second active pattern AP2 may be fin-shaped patterns protruding from the substrate 100.

A portion of the first active pattern AP1 and a portion of the second active pattern AP2 may protrude above the upper surface of the first field insulating layer 105.

The first connection gate structure 50 may cover a portion of the first active pattern AP1 and a portion of the second active pattern AP2 protruding above the upper surface of the first field insulating layer 105. For example, a deep trench DT that is deeper than the fin trench FT may be disposed between the first active pattern AP1 and the second active pattern AP2.

Unlike that illustrated in the drawing, as one example, the deep trench DT may not be formed between the first active pattern AP1 and the second active pattern AP2. As another example, a dummy fin pattern of which the upper surface is covered by the first field insulating layer 105 may be disposed between the first active pattern AP1 and the second active pattern AP2.

Although it is illustrated that one first active pattern AP1 and one second active pattern AP2 are disposed within the active region defined by the deep trench DT, this is only for simplicity of description, and the present disclosure is not limited thereto.

The second lower conductive liner 221 may be disposed on the second active pattern AP2. The second lower conductive liner 221 may be formed on the second gate insulating layer 230. The second lower conductive liner 121 may be disposed along a profile of the second active pattern AP2 disposed above the upper surface of the first field insulating layer 105.

The second lower conductive liner 221 may be directly in contact with the first lower conductive liner 121 on the upper surface of the first field insulating layer 105. For example, a thickness t31 of the first lower conductive liner 121 may be greater than a thickness t32 of the second lower conductive liner 221. A step shape may be formed at a boundary between the second lower conductive liner 221 and the first lower conductive liner 121. A step defined between the second lower conductive liner 221 and the first lower conductive liner 121 may be positioned at a boundary surface between the first gate structure 120 and the second gate structure 220.

The second lower conductive liner 221 includes the same material as the first lower conductive liner 121.

In FIG. 27, the gate shield insulating pattern 160 may be disposed on the upper surfaces of the lower conductive liners 121 and 221 having different thicknesses. In other words, although the thickness t31 of the first lower conductive liner 121 and the thickness t32 of the second lower conductive liner 221 are different, the thickness t1 of the gate shield insulating pattern 160 on the upper surface of the first lower conductive liner 121 is the same as the thickness t1 of the gate shield insulating pattern 160 on the upper surface of the second lower conductive liner 221.

Figure 28:
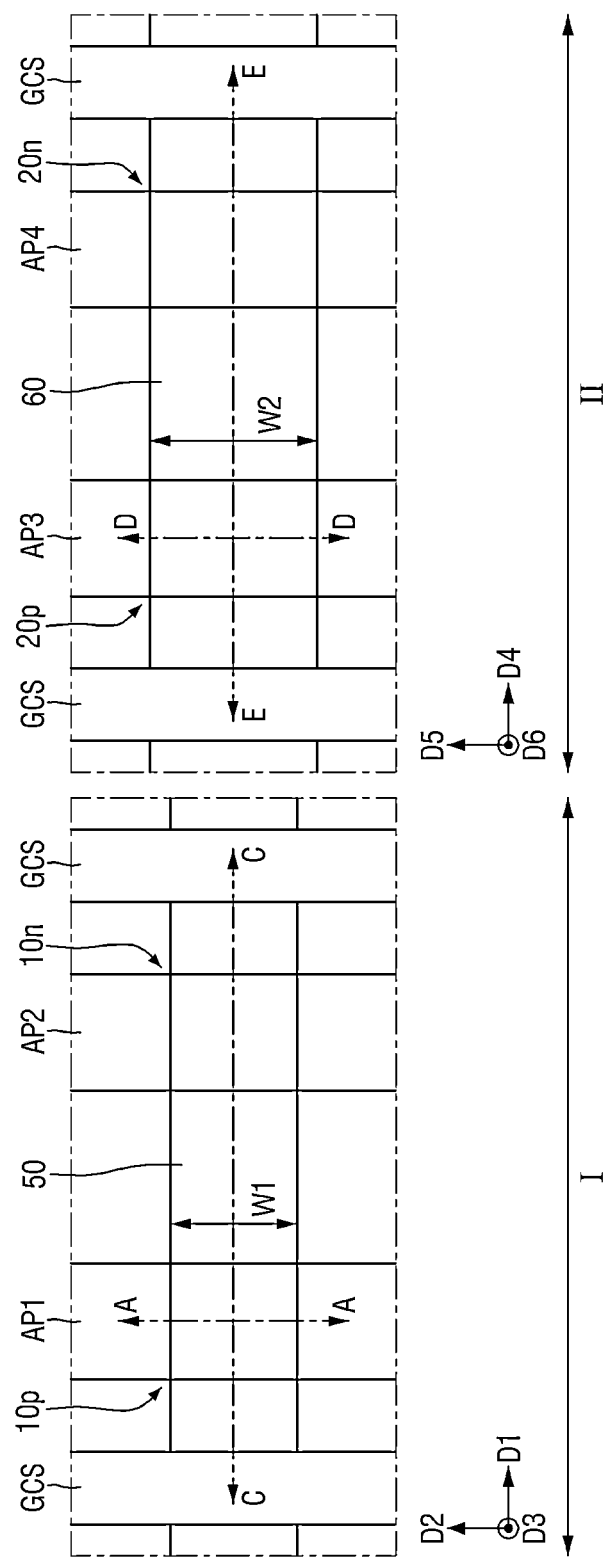
FIGS. 28 to 30 are diagrams illustrating a semiconductor device according to some example embodiments.
Figure 29:
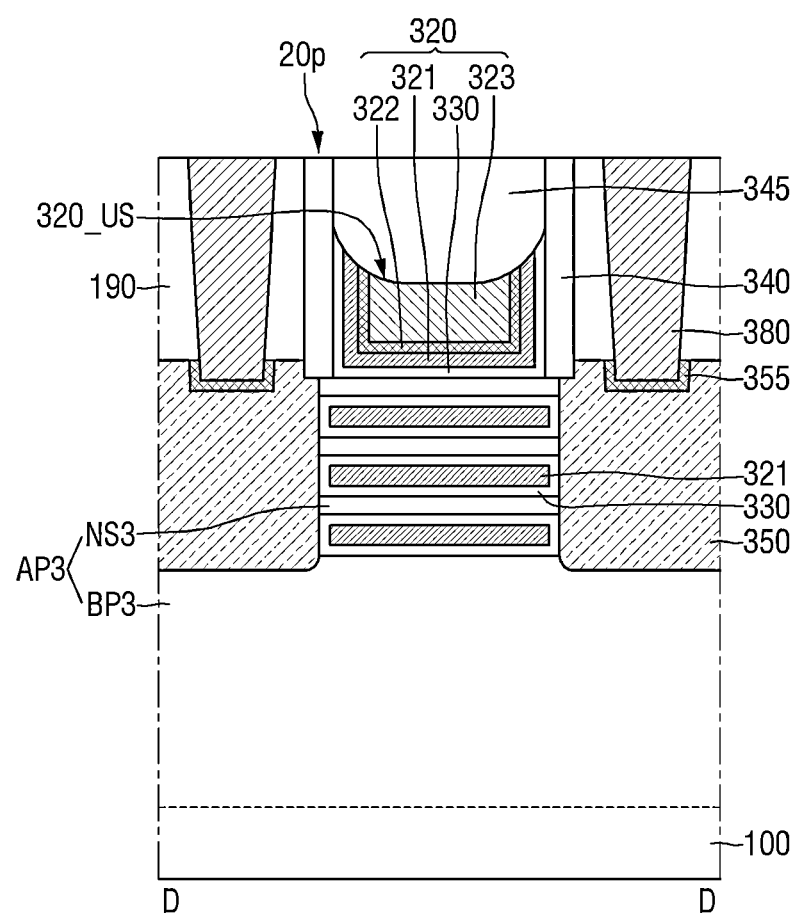
Figure 30:
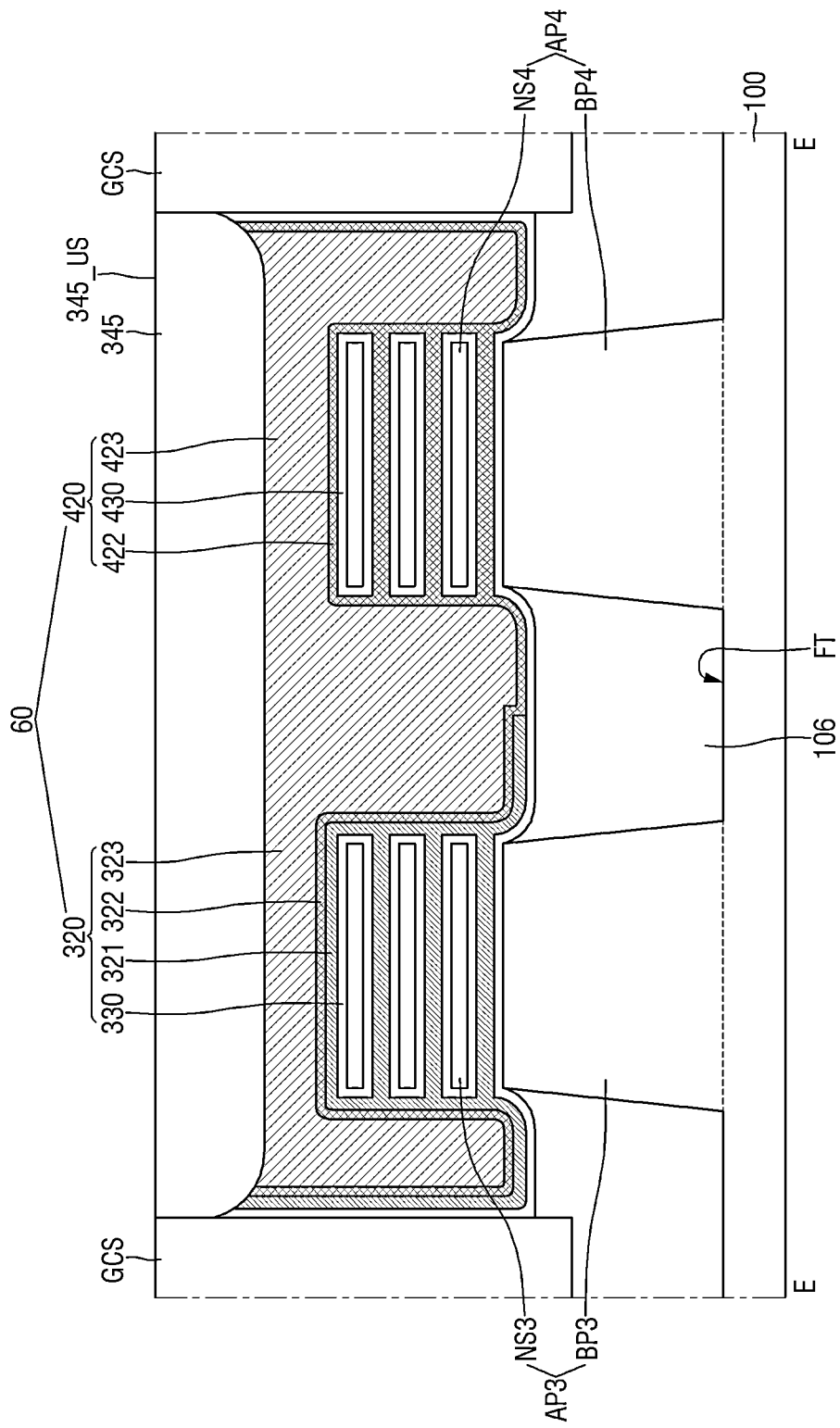

FIGS. 28 to 30 are diagrams illustrating a semiconductor device according to some example embodiments. For reference, FIG. 28 is a layout view illustrating a semiconductor device according to some example embodiments. FIGS. 29 and 30 are cross-sectional views taken along lines D-D and E-E of FIG. 28.

The first active pattern AP1, the second active pattern AP2, and the first connection gate structure 50 illustrated in a first region I of FIG. 28 may be the same as or substantially similar to those described with reference to FIGS. 1 to 27. In addition, the cross-sectional views taken along lines A-A and C-C of FIG. 16 may be the same as or substantially similar to one of the drawings described with reference to FIGS. 2 to 27. Accordingly, the following description will mainly focus on a second region II of FIG. 28 and FIGS. 29 and 30.

Further, in a fourth active pattern AP4 of FIG. 28, a cross-sectional view taken in a fifth direction D5 is not illustrated, but a person skilled in the art of the present disclosure may of course infer the cross-sectional view through the contents illustrated in FIGS. 2 to 27.

Referring to FIGS. 28 and 30, a semiconductor device according to some example embodiments may include the first active pattern AP1, the second active pattern AP2, and the first connection gate structure 50 that are disposed in the first region I, and a third active pattern AP3, the fourth active pattern AP4, and a second connection gate structure 60 that are disposed in the second region II.

A substrate 100 may include the first region I and the second region II. Each of the first region I and the second region II may be one of a logic region, an SRAM region, and an I/O region. As one example, the first region I and the second region II may be the same region. As another example, the first region I and the second region II may be different regions.

The third active pattern AP3 and the fourth active pattern AP4 may be disposed on the substrate 100. Each of the third active pattern AP3 and the fourth active pattern AP4 may be elongated in the fifth direction D5. The third active pattern AP3 and the fourth active pattern AP4 may be adjacent to each other in the fourth direction D4. The third active pattern AP3 may be a region in which a PMOS is formed, and the fourth active pattern AP4 may be a region in which an NMOS is formed.

The third active pattern AP3 may include a third lower pattern BP3 and a plurality of third sheet patterns NS3. The fourth active pattern AP4 may include a fourth lower pattern BP4 and a plurality of fourth sheet patterns NS4. The third lower pattern BP3 may be spaced apart from the fourth lower pattern BP4 in the fourth direction D4. The third lower pattern BP3 and the fourth lower pattern BP4 may be separated by the fin trench FT extending in the fifth direction D5.

The plurality of third sheet patterns NS3 may be disposed on the third lower pattern BP3. The plurality of third sheet patterns NS3 may be spaced apart from the third lower pattern BP3 in the third direction D3. The plurality of fourth sheet patterns NS4 may be disposed on the fourth lower pattern BP4. The plurality of fourth sheet patterns NS4 may be spaced apart from the fourth lower pattern BP4 in the sixth direction D6.

The second field insulating layer 106 may be formed on the substrate 100. The second field insulating layer 106 may be disposed on the substrate 100 between the third active pattern AP3 and the fourth active pattern AP4. The second field insulating layer 106 may be disposed between the third lower pattern BP3 and the fourth lower pattern BP4. The second field insulating layer 106 may cover a sidewall of the third lower pattern BP3 and a sidewall of the fourth lower pattern BP4. The second field insulating layer 106 may include, for example, an oxide layer, a nitride layer, an oxynitride layer, or a combination thereof.

The second connection gate structure 60 may be formed on the substrate 100. The second connection gate structure 60 may be disposed on the second field insulating layer 106. The second connection gate structure 60 may cross the third active pattern AP3, the fourth active pattern AP4, and the second field insulating layer 106. The second connection gate structure 60 may be elongated in the fourth direction D4. The fourth direction D4 may be a direction perpendicular to the fifth direction D5.

The second connection gate structure 60 may cross the third lower pattern BP3 and the fourth lower pattern BP4. The second connection gate structure 60 may surround each of the third sheet patterns NS3 and each of the fourth sheet patterns NS4.

For example, the width W2 in the fifth direction D5 of the second connection gate structure 60 is greater than the width W1 in the second direction D2 of the first connection gate structure 50.

The second connection gate structure 60 may include a third gate structure 320 and a fourth gate structure 420. The third gate structure 320 may be a p-type gate structure, and the fourth gate structure 420 may be an n-type gate structure.

The third gate structure 320 may be formed on the third active pattern AP3. The third gate structure 320 may cross the third active pattern AP3. The third gate structure 320 may cross the third lower pattern BP3. The third gate structure 320 may surround each of the third sheet patterns NS3.

The fourth gate structure 420 may be formed on the fourth active pattern AP4. The fourth gate structure 420 may cross the fourth active pattern AP4. The fourth gate structure 420 may cross the fourth lower pattern BP4. The fourth gate structure 420 may surround each of the fourth sheet patterns NS4.

A second p-channel transistor 20p may be defined in a region in which the third gate structure 320 and the third active pattern AP3 cross, and a second n-channel transistor 20n may be defined in a region in which the fourth gate structure 420 and the fourth active pattern AP4 cross.

The second connection gate structure 60 may include a second connection gate insulating layer 330 and 430 (e.g., a third gate insulating layer 330 and a fourth gate insulating layer 430), a third lower conductive liner 321, a second connection upper conductive liner 322 and 422 (a third upper conductive liner 322 and a fourth upper conductive liner 422), and a second connection gate filling layer 323 and 423 (e.g., a third gate filling layer 323 and a fourth gate filling layer 423).

The third gate structure 320 may include a third gate insulating layer 330, the third lower conductive liner 321, a third upper conductive liner 322, and a third gate filling layer 323. The fourth gate structure 420 may include a fourth gate insulating layer 430, a fourth upper conductive liner 422, and a fourth gate filling layer 423.

Because the third gate structure 320 and the fourth gate structure 420 may be the same as or substantially similar to the first gate structure 120 and the second gate structure 220 described with reference to FIGS. 1 to 6, redundant description will be omitted.

The third epitaxial pattern 350 may be disposed on the third lower pattern BP3. Although not illustrated, an epitaxial pattern may be disposed also on the fourth lower pattern BP4.

The second gate spacer 340 may be disposed on a sidewall of the second connection gate structure 60. The second gate spacer 340 may extend along a long sidewall of the second connection gate structure 60.

The second gate capping pattern 345 may be disposed on the second connection gate structure 60. The second gate capping pattern 345 may entirely cover an upper surface 320_US of the third gate structure 320. An upper surface 345_US of the second gate capping pattern 345 may be on the same plane as the upper surface of the interlayer insulating layer 190 and the upper surface of the gate cutting structure GCS.

The upper surface 320_US of the third gate structure 320 may include the upper surface of the third gate insulating layer 330, the upper surface of the third lower conductive liner 321, the upper surface of the third upper conductive liner 322, and the upper surface of the third gate filling layer 323. For example, the upper surface 320_US of the third gate structure 320 may have a concave shape. With respect to the upper surface of the third active pattern AP3, the upper surface of the third gate insulating layer 330 may be higher than the upper surface of the third lower conductive liner 321. The upper surface of the third lower conductive liner 321 may be higher than the upper surface of the third upper conductive liner 322. The upper surface of the third upper conductive liner 322 may be higher than the upper surface of the third gate filling layer 323.

For example, the second gate capping pattern 345 may be in contact with the upper surface of the third gate insulating layer 330, the upper surface of the third lower conductive liner 321, the upper surface of the third upper conductive liner 322, and the upper surface of the third gate filling layer 323.

Because the content regarding the upper surface of the fourth gate structure 420 may be the same as or substantially similar to the content regarding the upper surface 320_US of the third gate structure, it will be omitted below.

FIGS. 31 to 46 are views illustrating intermediate steps of a method of fabricating a semiconductor device according to some example embodiments.

For reference, FIGS. 31, 33, 35, 37, 39, 41, 43 and 45 are intermediate step views taken along line A-A of FIG. 1. FIGS. 32, 34, 36, 38, 40, 42, 44 and 46 are intermediate step views taken along line C-C of FIG. 1.

Figure 31:
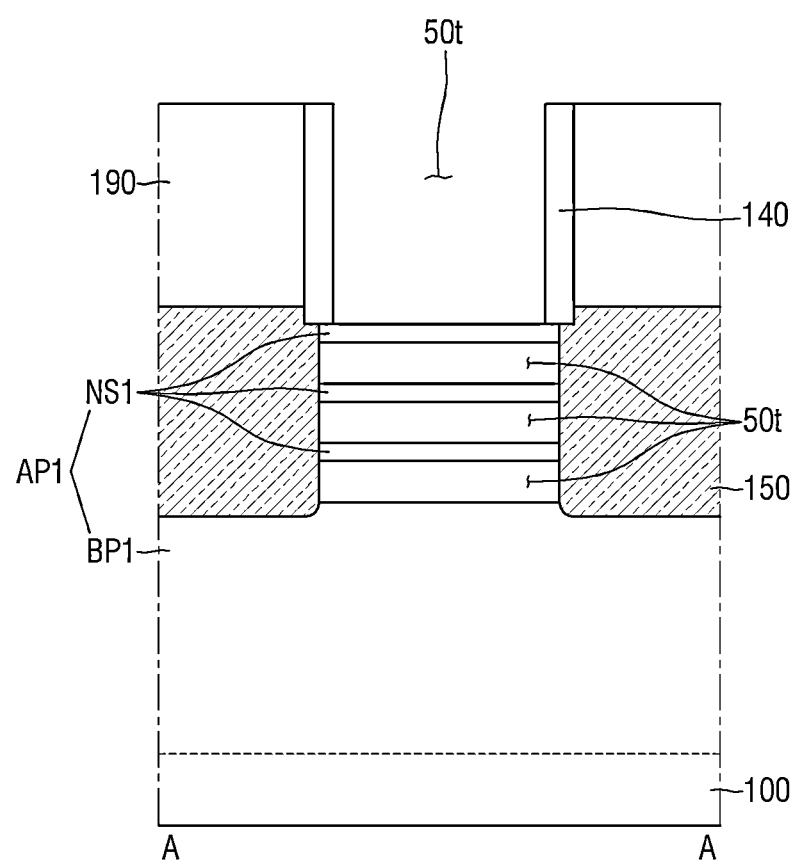
FIGS. 31 to 46 are views illustrating intermediate steps of a method of fabricating a semiconductor device according to some example embodiments.
Figure 32:
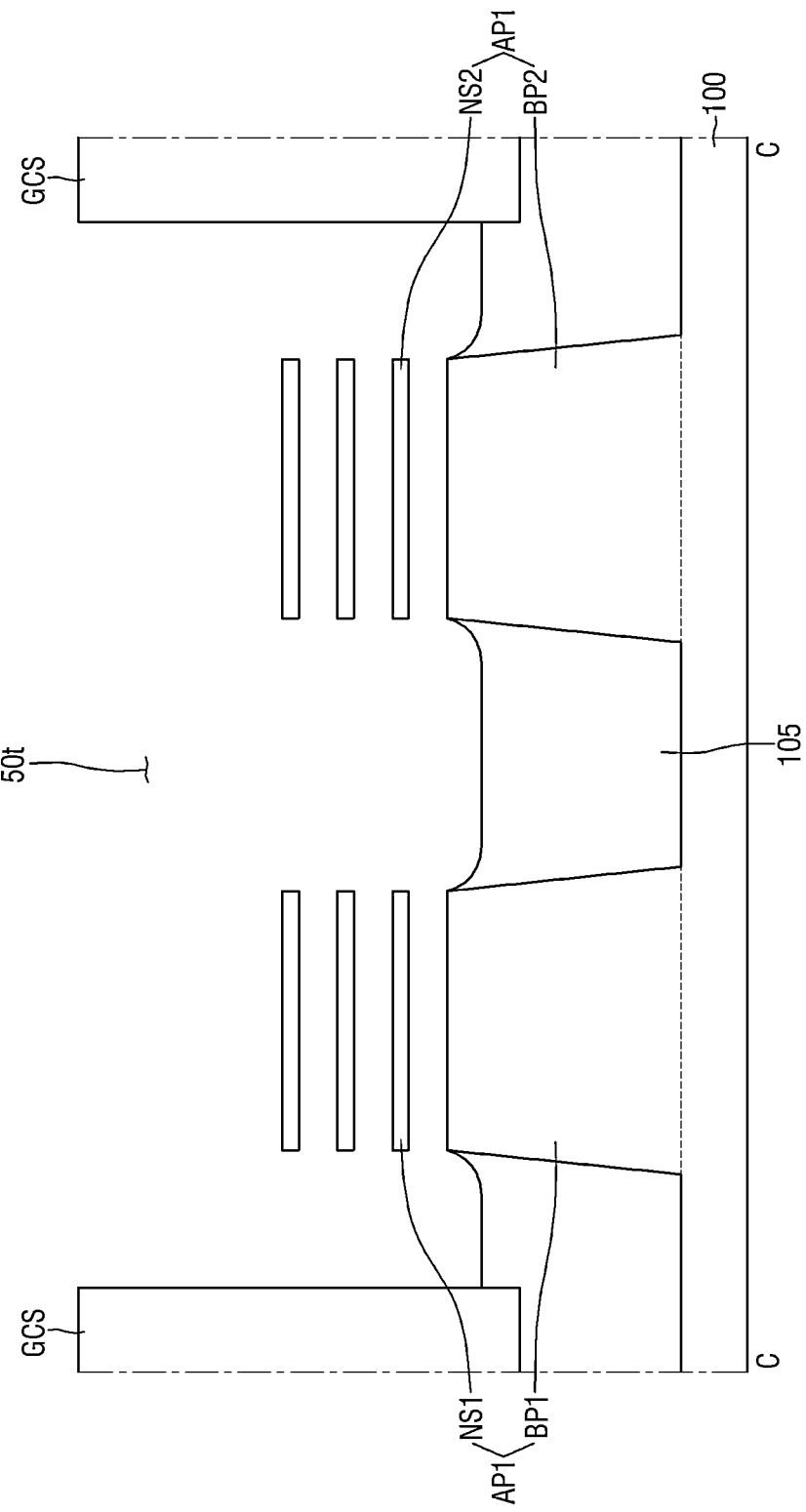

Referring to FIGS. 31 and 32, a gate trench 50t crossing the first active pattern AP1 and the second active pattern AP2 may be formed on the substrate 100.

The gate trench 50t may be defined by the first gate spacer 140.

While the gate trench 50t is formed, the first active pattern AP1 and the second active pattern AP2 may be formed. More specifically, when the gate trench 50t is formed, the first sheet pattern NS1 spaced apart from the first lower pattern BP1 and the second sheet pattern NS2 spaced apart from the second lower pattern BP2 may be formed.

Figure 33:
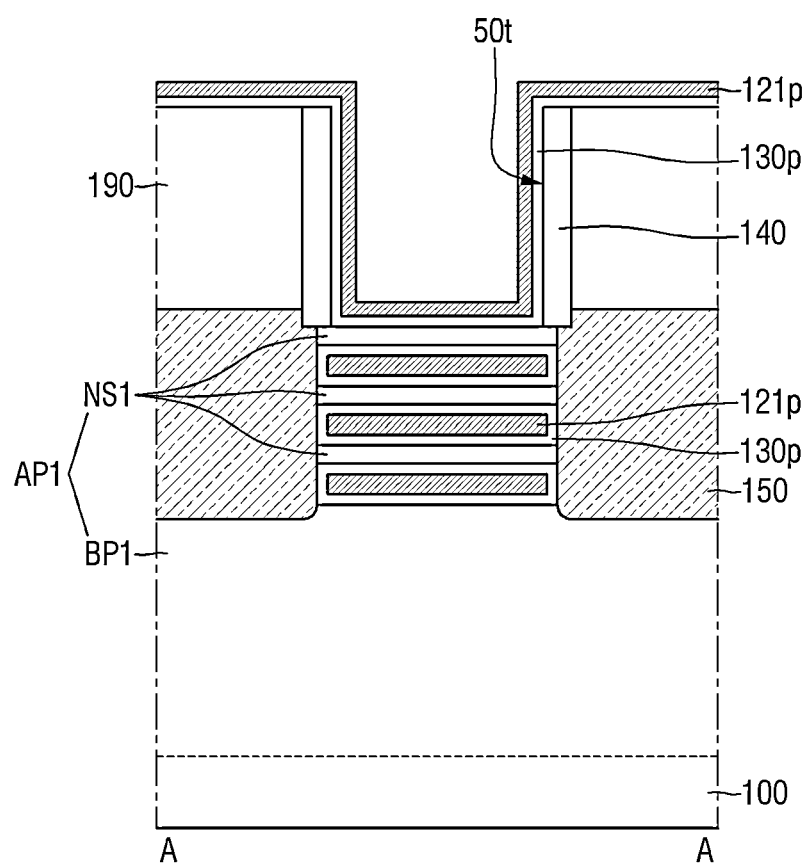
Figure 34:
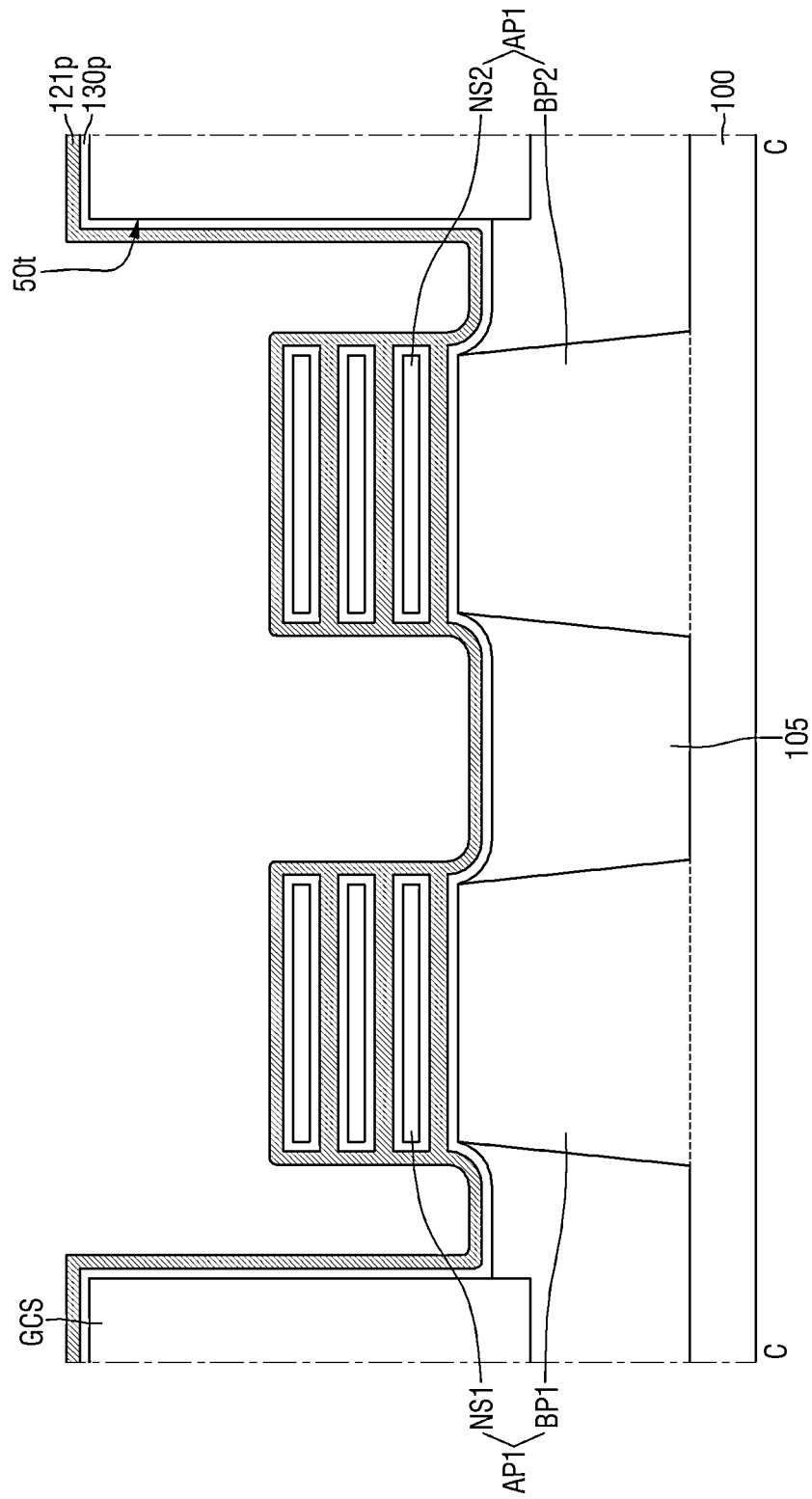

Referring to FIGS. 33 and 34, a pre-gate insulating layer 130p and a lower gate conductive layer 121p may be sequentially formed along the sidewall and the bottom surface of the gate trench 50t.

The pre-gate insulating layer 130p may extend along the upper surface of the first field insulating layer 105, the upper surface of the first lower pattern BP1, and the upper surface of the second lower pattern BP2. The pre-gate insulating layer 130p may be formed along the perimeter of the first sheet pattern NS1 and the perimeter of the second sheet pattern NS2.

The lower gate conductive layer 121p may be formed on the pre-gate insulating layer 130p. The lower gate conductive layer 121p may entirely fill a space between the first lower pattern BP1 and the first sheet pattern NS1 and a space between the adjacent first sheet patterns NS1. Further, the lower gate conductive layer 121p may entirely fill a space between the second lower pattern BP2 and the second sheet pattern NS2 and a space between the adjacent second sheet patterns NS2.

Figure 35:
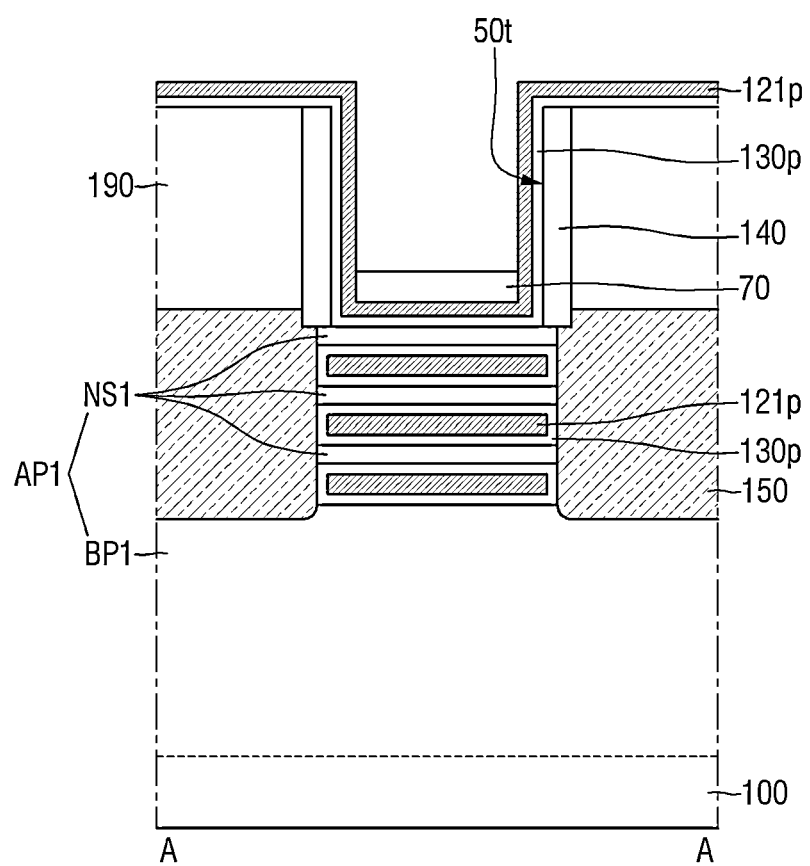
Figure 36:
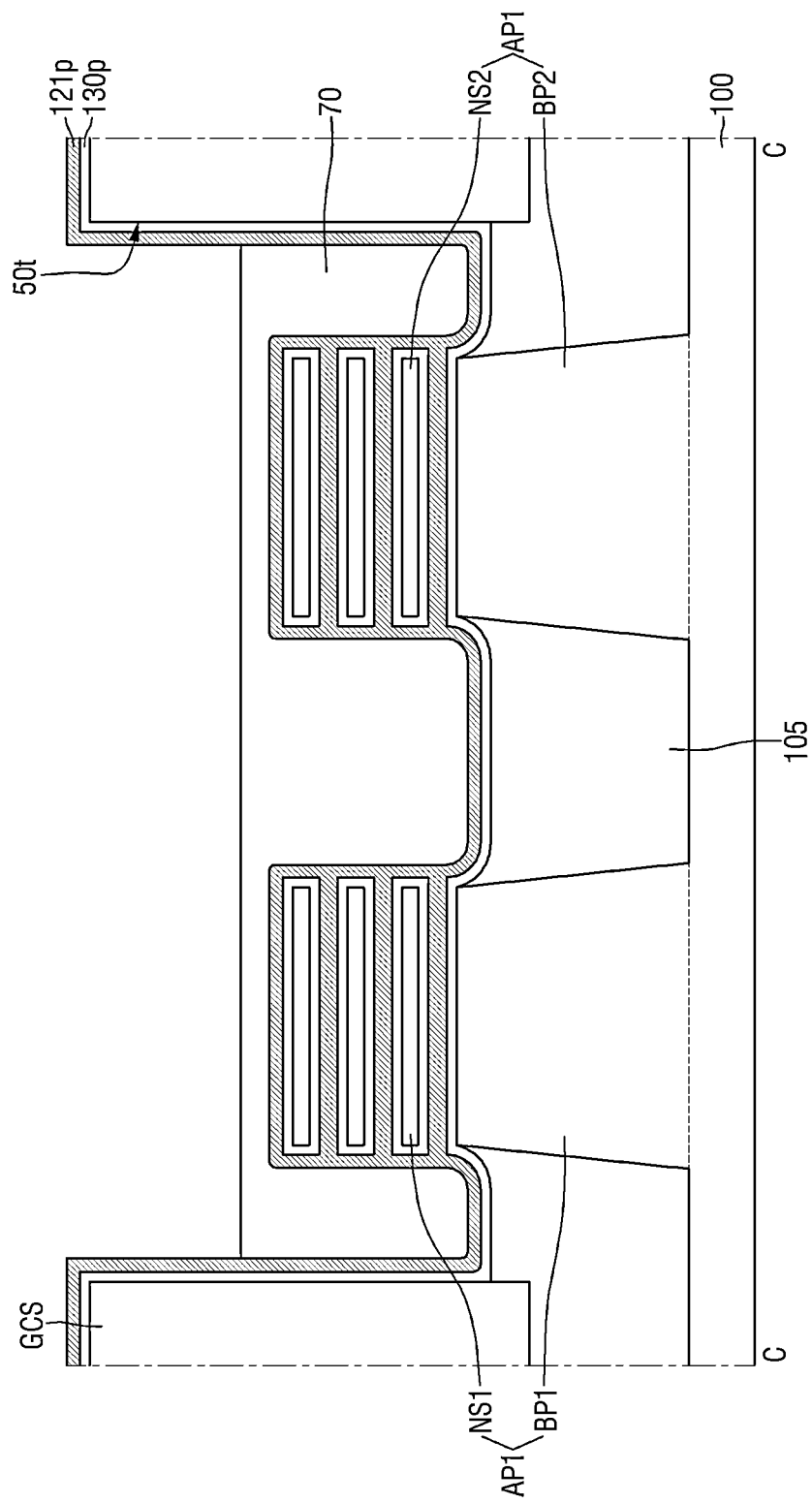

Referring to FIGS. 35 and 36, a sacrificial pattern 70 may be formed on the lower gate conductive layer 121p.

The sacrificial pattern 70 may fill a part of the gate trench 50t. The sacrificial pattern 70 may include, for example, an amorphous carbon layer (ACL), a spin on hardmask (SOH), or a photoresist film (PR), but is not limited thereto.

Figure 37:
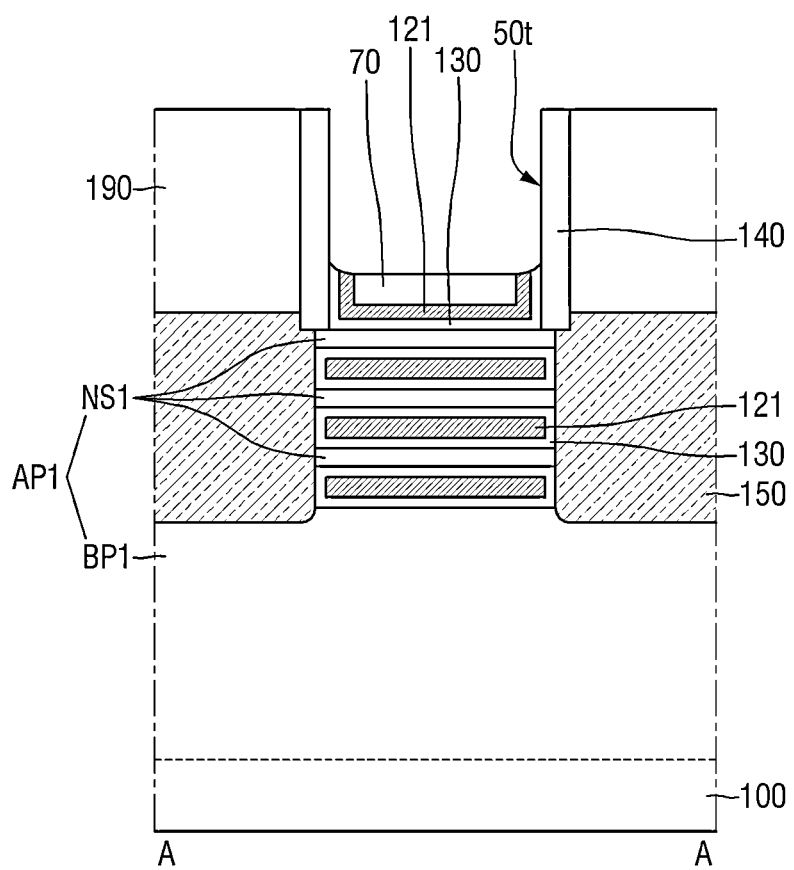
Figure 38:
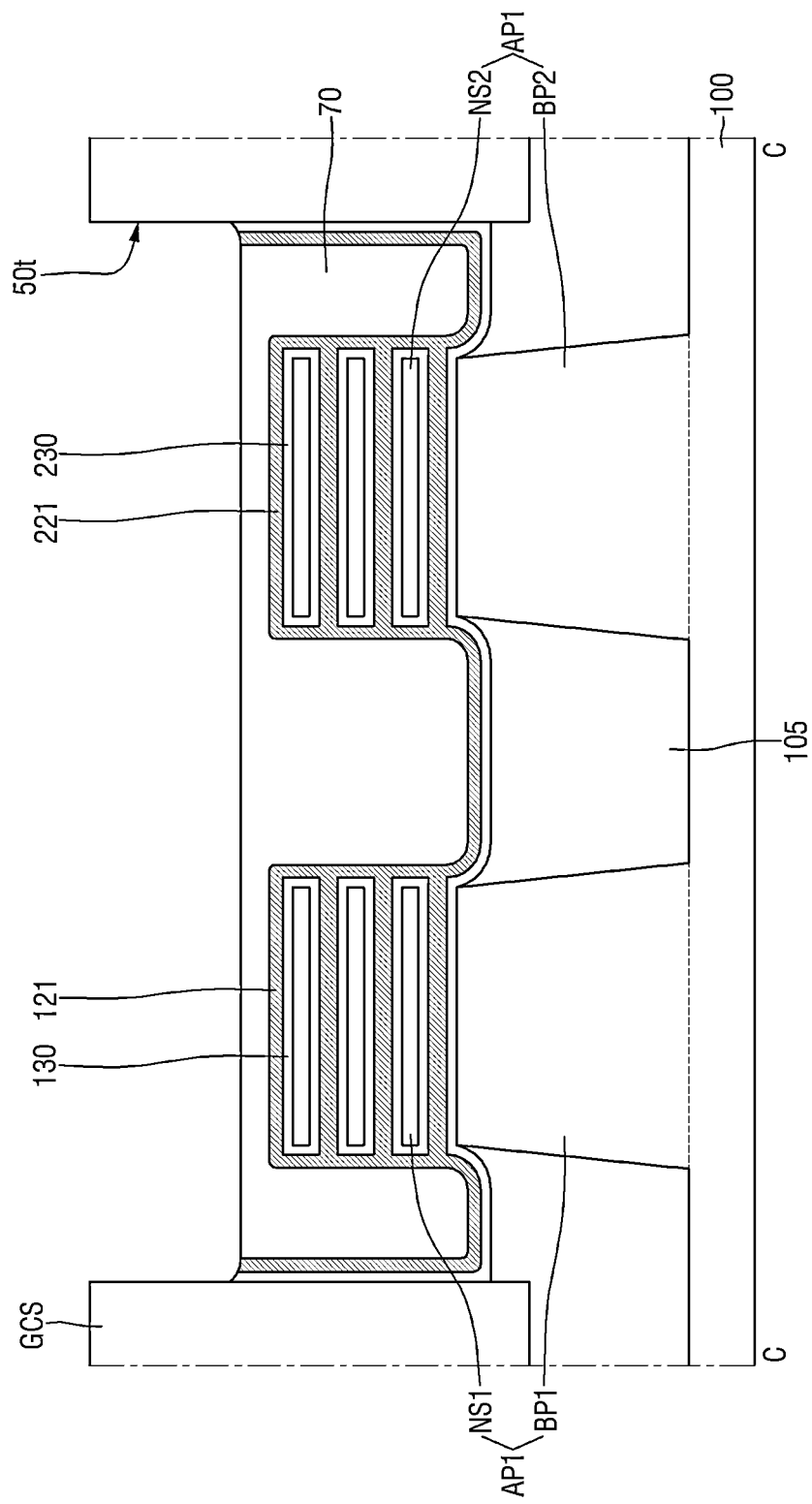
Figure 39:
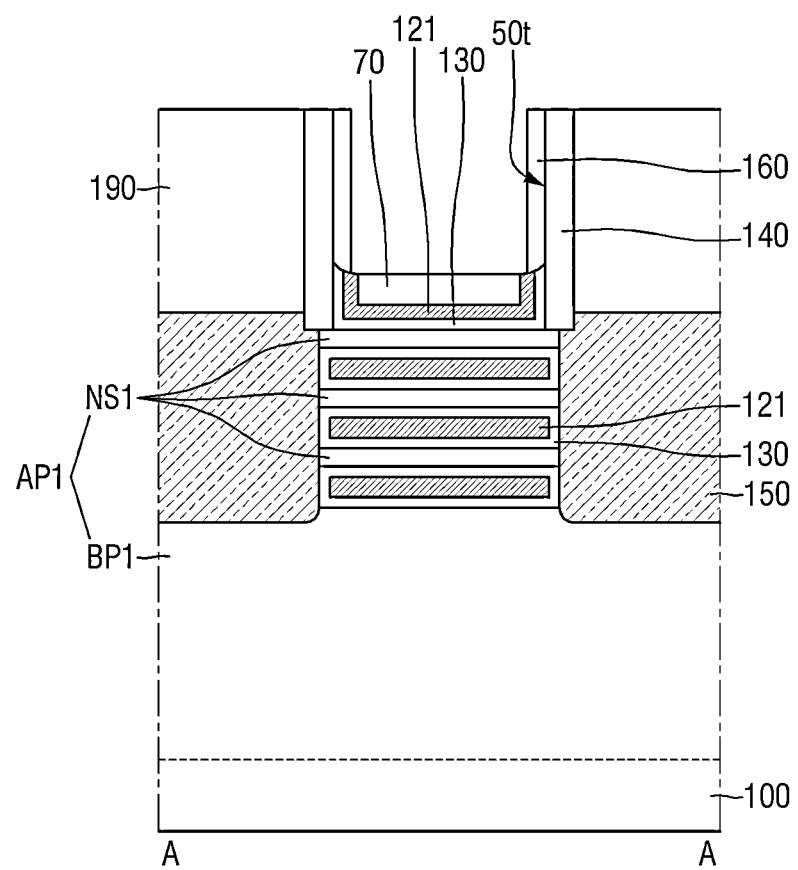
Figure 40:
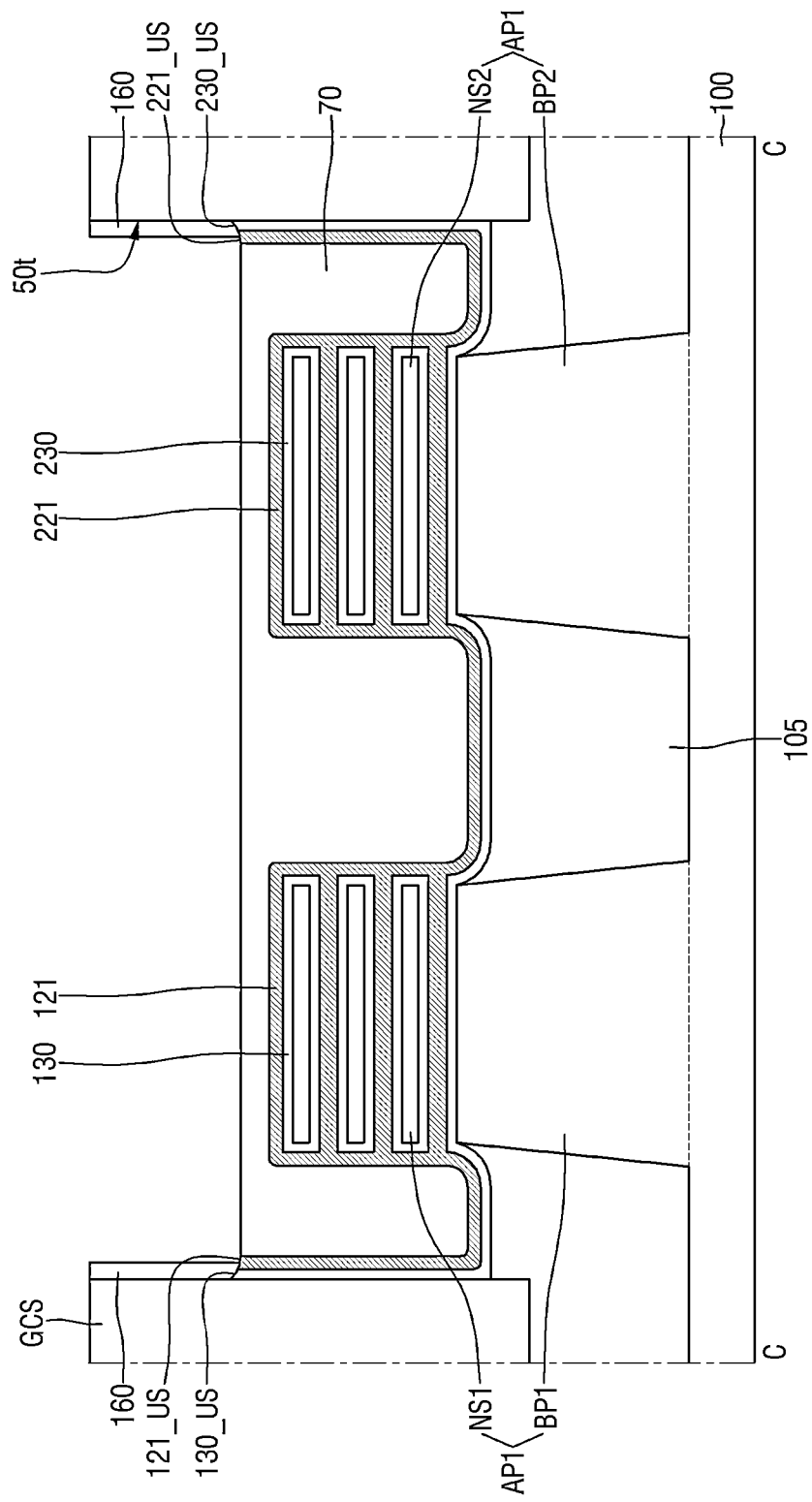
Figure 41:
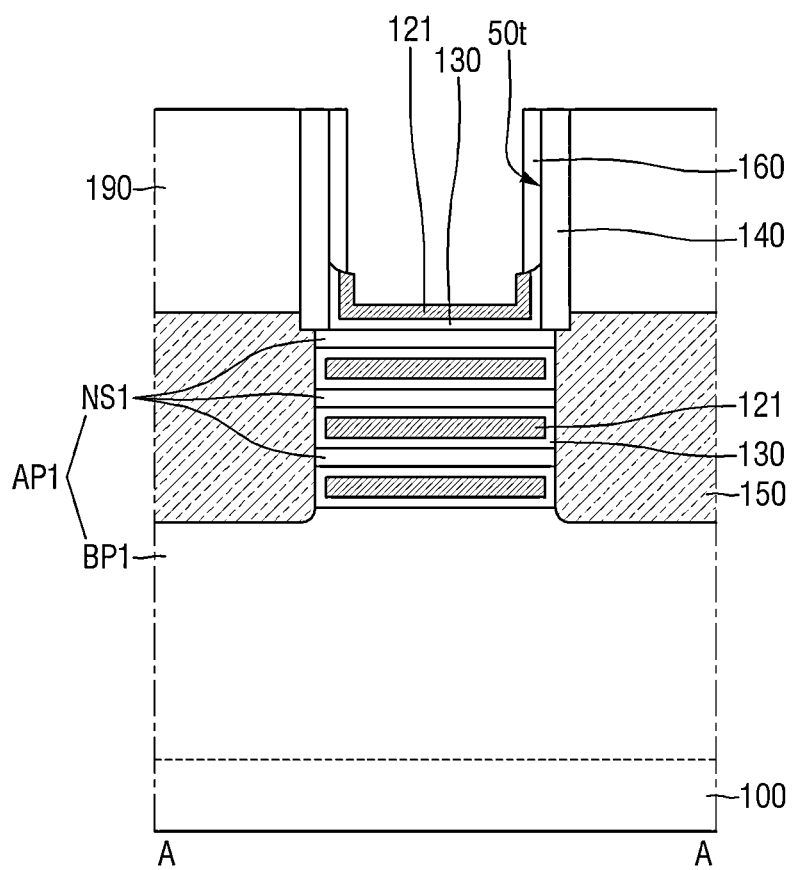
Figure 42:
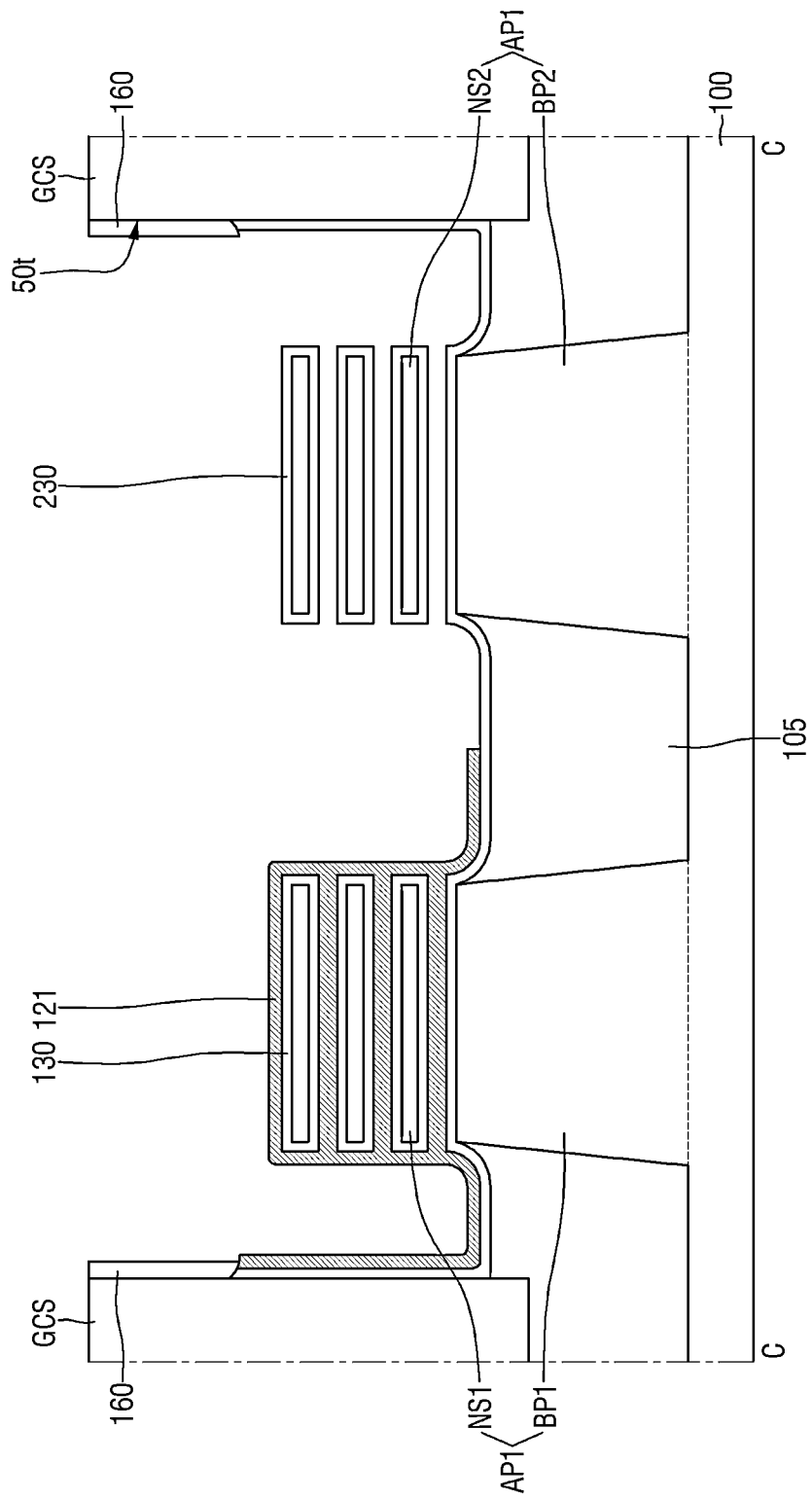

Referring to FIGS. 37 and 38, the pre-gate insulating layer 130p and the lower gate conductive layer 121p protruding above the upper surface of the sacrificial pattern 70 may be removed using the sacrificial pattern 70.

Accordingly, the first gate insulating layer 130, the second gate insulating layer 230, the first lower conductive liner 121, and the second lower conductive liner 221 may be formed in the gate trench 50t.

The upper surface of the first gate insulating layer 130 and the upper surface of the first lower conductive liner 121 may include inclined surfaces. The upper surface of the second gate insulating layer 230 and the upper surface of the second lower conductive liner 221 may include inclined surfaces.

Referring to FIGS. 39 to 42, the gate shield insulating pattern 160 may be formed on the upper surface 130_US of the first gate insulating layer 130 and the upper surface 121_US of the first lower conductive liner 121. The gate shield insulating pattern 160 may be formed on the upper surface 230_US of the second gate insulating layer 230 and an upper surface 221_US of the second lower conductive liner 221.

The gate shield insulating pattern 160 may extend along the sidewall of the gate trench 50t. The gate shield insulating pattern 160 may be formed on a portion of the sidewall of the first gate spacer 140 and a portion of the sidewall of the gate cutting structure GCS.

Subsequently, the sacrificial pattern 70 in the gate trench 50t may be removed.

Although not illustrated, after the sacrificial pattern 70 is removed, a mask pattern filling a part of the gate trench 50t may be formed. The mask pattern overlaps the first active pattern AP1 in the third direction D3, but does not overlap the second active pattern AP2 in the third direction D3. The mask pattern covers the first lower conductive liner 121 but does not cover the second lower conductive liner 221.

The second lower conductive liner 221 may be removed using the mask pattern.

Subsequently, the mask pattern may be removed.

Figure 43:
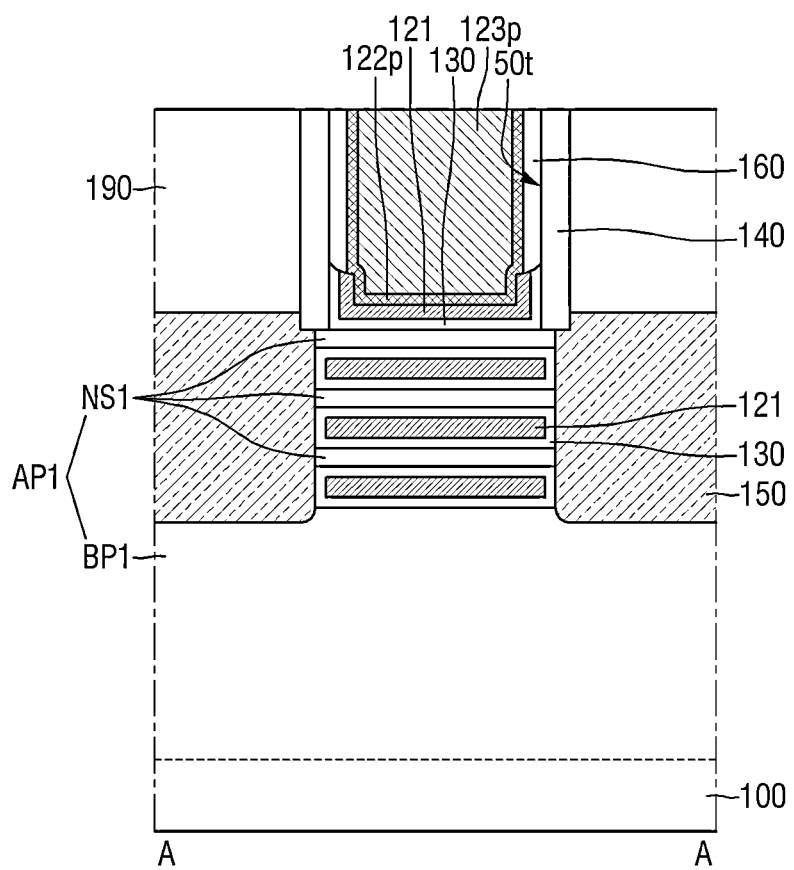
Figure 44:
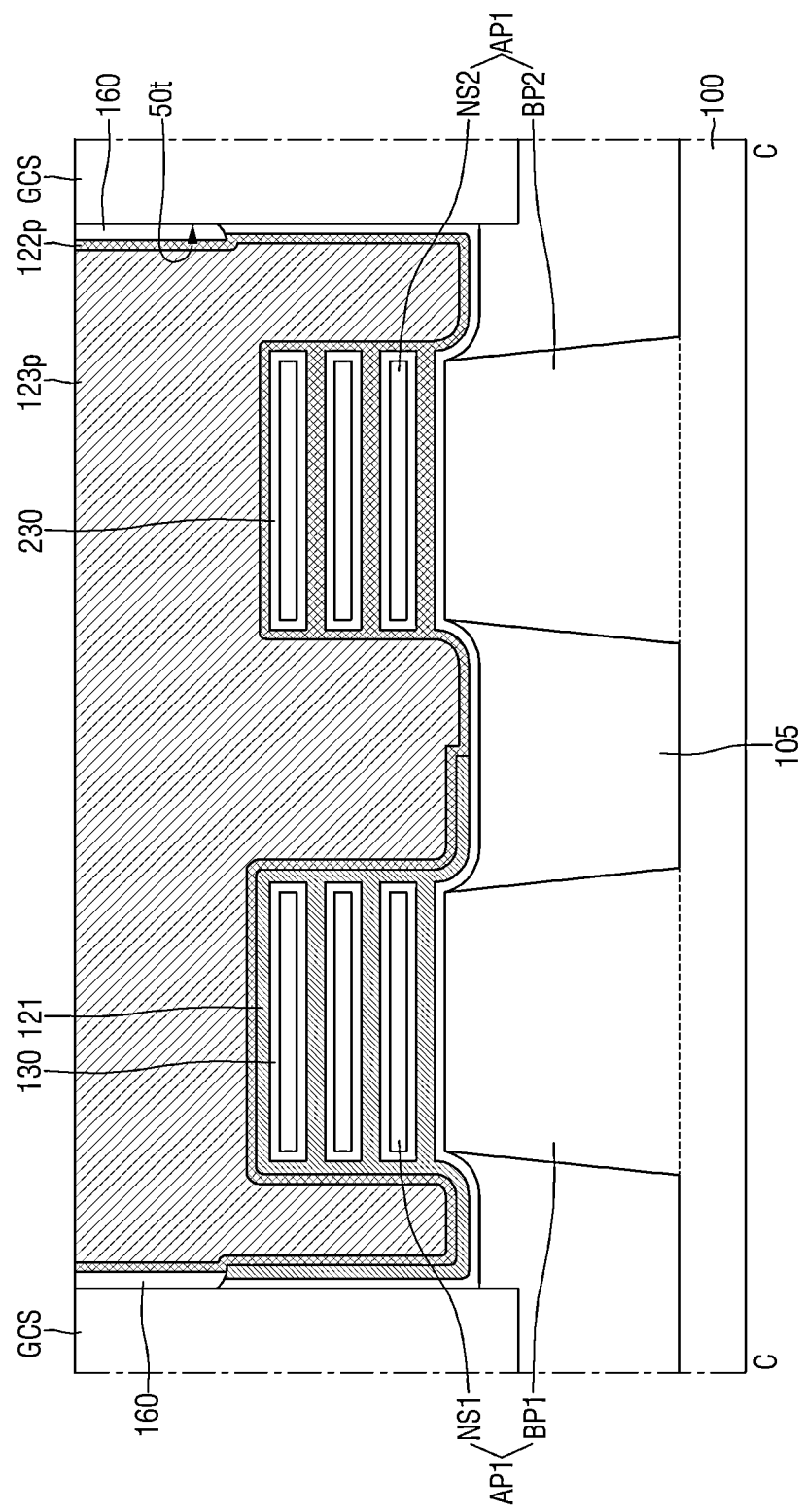

Referring to FIGS. 43 and 44, an upper gate conductive layer 122p and a pre-gate filling layer 123p may be formed on the first lower conductive liner 121 and the gate shield insulating pattern 160.

The upper gate conductive layer 122p may extend along the first lower conductive liner 121 and the second gate insulating layer 230. The upper gate conductive layer 122p extends along the sidewall of the gate shield insulating pattern 160. The upper gate conductive layer 122p covers the sidewall of the gate shield insulating pattern 160.

The pre-gate filling layer 123p may be formed on the upper gate conductive layer 122p. The pre-gate filling layer 123p may fill the gate trench 50t.

Figure 45:
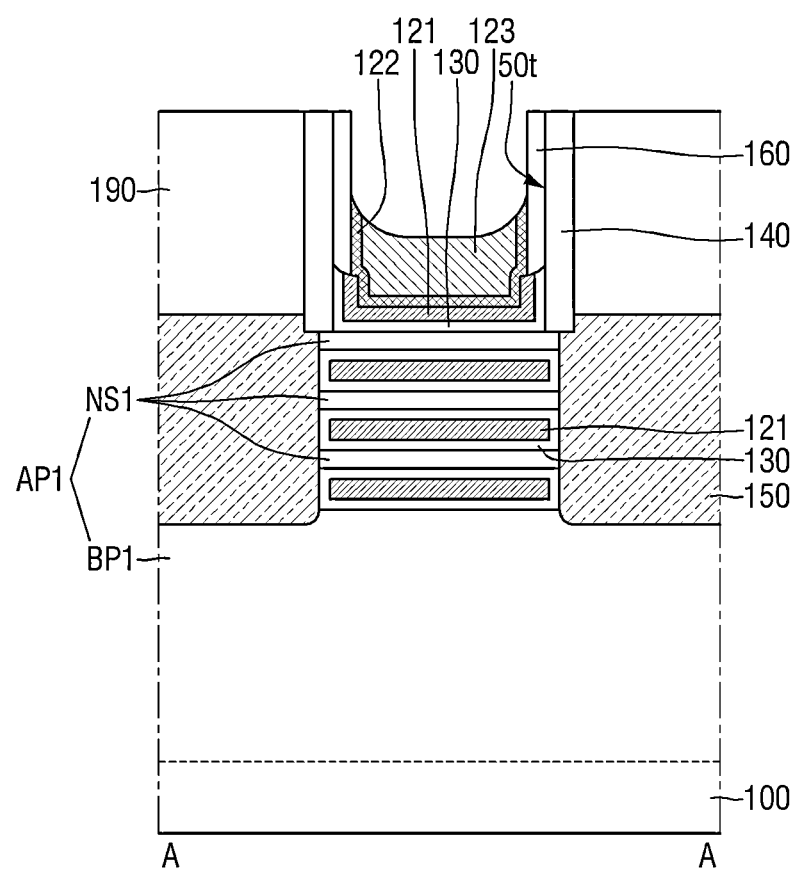
Figure 46:
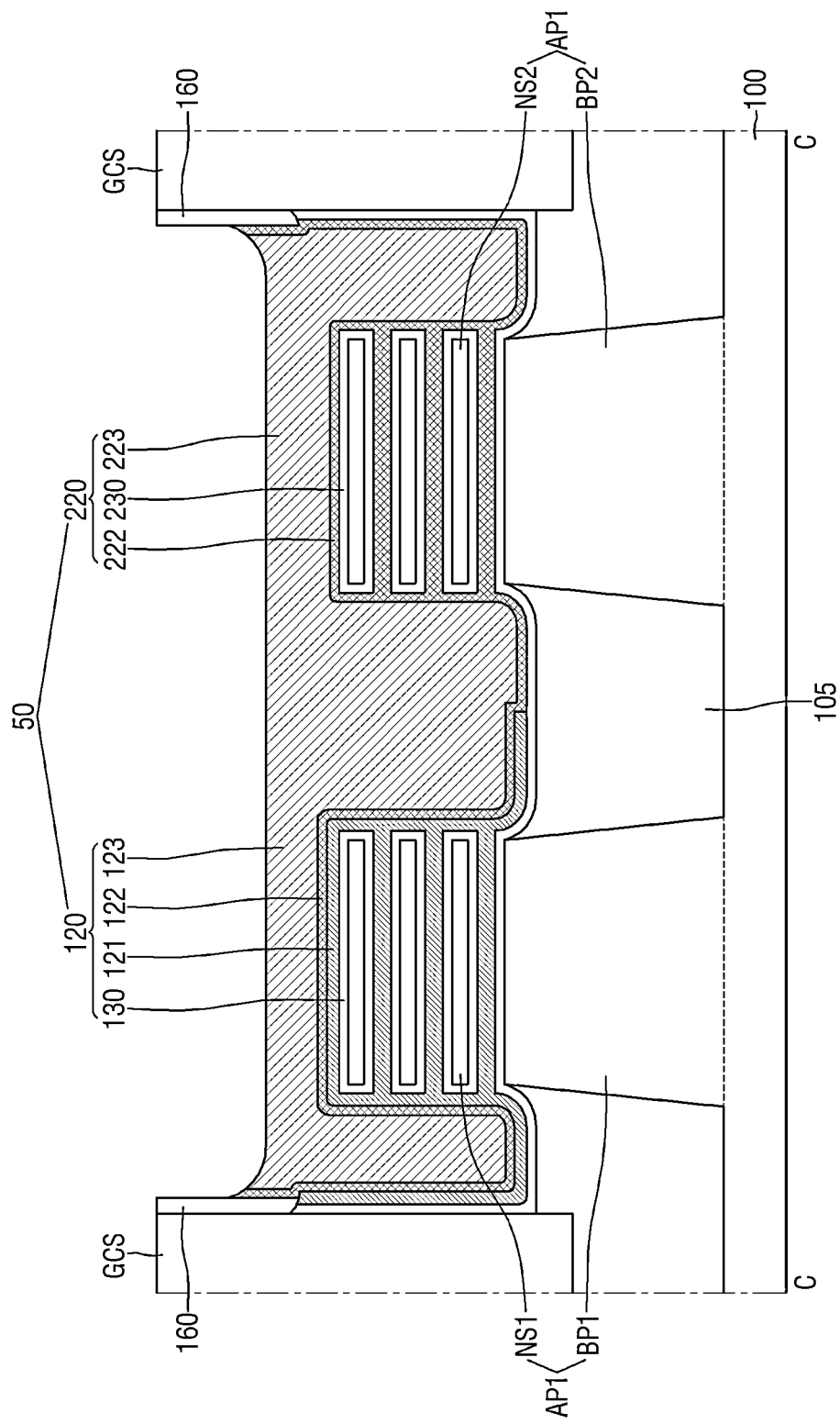

Referring to FIGS. 45 and 46, a part of the pre-gate filling layer 123p and the upper gate conductive layer 122p may be removed to form the first upper conductive liner 122, the second upper conductive liner 222, the first gate filling layer 123, and the second gate filling layer 223.

Subsequently, referring to FIGS. 2 to 4, the first gate capping pattern 145 may be formed on the first gate filling layer 123 and the second gate filling layer 223.

The first gate capping pattern 145 may fill the gate trench 50t remaining after the first connection gate structure 50 is formed.

Unlike that illustrated in the drawing, before the first gate capping pattern 145 is removed, the gate shielding insulating pattern 160 may be removed. In this case, the first gate capping pattern 145 may also fill a space in which the gate shielding insulating pattern 160 is removed. When the gate shielding insulating pattern 160 is removed, the gate shielding insulating pattern 160 may include silicon oxide or a low-k material having a dielectric constant smaller than that of silicon oxide, but is not limited thereto.

In concluding the detailed description, those skilled in the art will appreciate that many variations and modifications may be made to the disclosed example embodiments without substantially departing from the principles of the present inventive concepts. Therefore, the disclosed example embodiments of the inventive concepts are used in a generic and descriptive sense only and not for purposes of limitation.

What is claimed is:
1. A semiconductor device comprising:
an active pattern extending in a first direction;
a gate structure on the active pattern, the gate structure extending in a second direction different from the first direction, the gate structure including a gate insulating layer, a gate filling layer, and a conductive liner disposed at least partially between the gate filling layer and the gate insulating layer;
a gate spacer extending in the second direction, on a sidewall of the gate structure;
a gate shield insulating pattern on a sidewall of the gate spacer, the gate shield insulating pattern covering an upper surface of the gate insulating layer, and the gate shield insulating pattern including an insulating material; and
a gate capping pattern covering an upper surface of the gate filling layer, on the gate structure,
wherein the conductive liner extends along a bottom surface of the gate shield insulating pattern and a sidewall of the gate shield insulating pattern.
2. The semiconductor device of claim 1, wherein
the gate structure further includes a lower conductive liner between the gate filling layer and the gate insulating layer, and
the gate shield insulating pattern covers at least a part of an upper surface of the lower conductive liner.
3. The semiconductor device of claim 2, wherein a thickness of the gate shield insulating pattern is smaller than a sum of a thickness of the gate insulating layer and a thickness of the lower conductive liner.
4. The semiconductor device of claim 2, wherein a thickness of the gate shield insulating pattern is equal to a sum of a thickness of the gate insulating layer and a thickness of the lower conductive liner.
5. The semiconductor device of claim 2, wherein
the gate structure further includes an upper conductive liner between the lower conductive liner and the gate filling layer, and
a portion of the upper conductive liner extends between the gate filling layer and the gate shield insulating pattern.
6. The semiconductor device of claim 1, wherein with respect to an upper surface of the active pattern, the upper surface of the gate insulating layer is lower than the upper surface of the gate filling layer.

7. The semiconductor device of claim 1, wherein the gate capping pattern covers an upper surface of the gate shield insulating pattern.

8. The semiconductor device of claim 1, wherein the gate shield insulating pattern is not between the gate insulating layer and the gate spacer.

9. The semiconductor device of claim 1, wherein the active pattern includes a fin-shaped pattern.

10. The semiconductor device of claim 9, wherein the active pattern further includes a sheet pattern spaced apart from the fin-shaped pattern, on the fin-shaped pattern.

11. A semiconductor device comprising:
- a first gate structure extending in a first direction in a first region of a substrate and including a first gate insulating layer, a first gate filling layer, and a conductive liner disposed at least partially between the gate filling layer and the gate insulating layer;
- a second gate structure extending in a second direction in a second region of the substrate and including a second gate insulating layer and a second gate filling layer;
- a first gate spacer extending in the first direction, on a sidewall of the first gate structure;
- a second gate spacer extending in the second direction, on a sidewall of the second gate structure;
- a gate shield insulating pattern on a sidewall of the first gate spacer, the gate shield insulating pattern covering an upper surface of the first gate insulating layer, and the gate shield insulating pattern including an insulating material;
- a first gate capping pattern covering an upper surface of the first gate filling layer, on the first gate structure; and
- a second gate capping pattern covering an upper surface of the second gate structure, on the second gate structure,
- wherein a width of the first gate structure in a third direction perpendicular to the first direction is smaller than a width of the second gate structure in a fourth direction perpendicular to the second direction, and
- wherein the conductive liner extends along a bottom surface of the gate shield insulating pattern and a sidewall of the gate shield insulating pattern.

12. The semiconductor device of claim 11, wherein
the first gate capping pattern is not in contact with the first gate insulating layer, and
the second gate capping pattern is in contact with the second gate insulating layer.

13. The semiconductor device of claim 11, wherein
the gate shield insulating pattern covers at least a part of an upper surface of the conductive liner.

14. A semiconductor device comprising:
- an active pattern including a fin-shaped pattern extending in a first direction and a sheet pattern on the fin-shaped pattern;
- a gate structure on the active pattern, the gate structure extending in a second direction different from the first direction, the gate structure including a gate insulating layer, a gate filling layer, and a conductive liner disposed at least partially between the gate filling layer and the gate insulating layer;
- a gate spacer extending in the second direction, on a sidewall of the gate structure;
- a gate shield insulating pattern on a portion of a sidewall of the gate spacer, the gate shield insulating pattern covering an upper surface of the gate insulating layer, and the gate shield insulating pattern including an insulating material; and
- a gate capping pattern on the gate structure, the gate capping pattern covering an upper surface of the gate filling layer and being not in contact with the upper surface of the gate insulating layer,
- wherein with respect to an upper surface of the sheet pattern, the upper surface of the gate insulating layer is lower than the upper surface of the gate filling layer, and
- wherein the conductive liner extends along a bottom surface of the gate shield insulating pattern and a sidewall of the gate shield insulating pattern.

15. The semiconductor device of claim 14, wherein
the gate shield insulating pattern covers at least a part of an upper surface of the conductive liner.

16. The semiconductor device of claim 14, wherein the gate capping pattern covers an upper surface of the gate shield insulating pattern.

* * * * *